United States Patent
Tsai

(10) Patent No.: US 12,342,571 B2
(45) Date of Patent: Jun. 24, 2025

(54) METHOD FOR MANUFACTURING SEMICONDUCTOR DEVICE WITH PASSING GATE

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 469 days.

(21) Appl. No.: 17/862,087

(22) Filed: Jul. 11, 2022

(65) Prior Publication Data

US 2024/0014314 A1   Jan. 11, 2024

(51) Int. Cl.
| | |
|---|---|
| H10D 30/66 | (2025.01) |
| H10D 64/01 | (2025.01) |
| H10D 64/27 | (2025.01) |
| H10D 84/01 | (2025.01) |
| H10D 84/03 | (2025.01) |

(52) U.S. Cl.
CPC ......... *H10D 30/668* (2025.01); *H10D 64/017* (2025.01); *H10D 64/513* (2025.01); *H10D 84/0135* (2025.01); *H10D 84/038* (2025.01)

(58) Field of Classification Search
CPC .. H10D 30/668; H10D 64/017; H10D 64/513; H10D 84/0135; H10D 84/038; H01L 21/28088; H01L 29/4966; H01L 29/4236; H01L 29/78; H01L 29/66621; H01L 29/4983; H01L 29/42356; H10B 12/34; H10B 12/053; H10B 12/488; H10B 12/30
See application file for complete search history.

(56) References Cited

U.S. PATENT DOCUMENTS

| | | | |
|---|---|---|---|
| 9,653,583 B1 * | 5/2017 | Zhao | H10D 30/024 |
| 9,972,627 B2 | 5/2018 | Jang et al. | |
| 2016/0056160 A1 * | 2/2016 | Jang | H10B 12/34 |
| | | | 257/331 |
| 2018/0130806 A1 * | 5/2018 | Nam | H10B 12/056 |
| 2020/0105765 A1 | 4/2020 | Kim et al. | |
| 2020/0161305 A1 * | 5/2020 | Nam | H10D 62/115 |
| 2022/0093593 A1 * | 3/2022 | Yang | H10D 84/038 |
| 2022/0122888 A1 | 4/2022 | Kim et al. | |

FOREIGN PATENT DOCUMENTS

TW   202131514 A   8/2021

OTHER PUBLICATIONS

Office Action dated Jan. 7, 2025 of U.S. Appl. No. 17/861,281 and the cited reference of this Office Action; pp. 1-18.

* cited by examiner

*Primary Examiner* — Fernando L Toledo
*Assistant Examiner* — Ryan T. Fortin
(74) *Attorney, Agent, or Firm* — MUNCY, GEISSLER, OLDS & LOWE, P.C.

(57) ABSTRACT

The present disclosure provides a method of manufacturing a semiconductor device. The method includes forming a first trench in a substrate, disposing a first gate electrode in the first trench, and disposing a dummy gate electrode on the first gate electrode in the first trench. The method also includes removing the dummy gate electrode from the first gate electrode and forming a first doped region in the first gate electrode.

20 Claims, 24 Drawing Sheets

METHOD FOR MANUFACTURING SEMICONDUCTOR DEVICE WITH PASSING GATE

TECHNICAL FIELD

The present disclosure relates to a method for manufacturing a semiconductor device with a passing gate, and more particularly, to a method for manufacturing a buried gate structure having a doped electrode.

DISCUSSION OF THE BACKGROUND

A buried gate structure of a semiconductor device includes a gate dielectric layer and a gate electrode in a trench. The gate dielectric layer covers the surface of the trench and the gate electrode partially fills the trench on the gate dielectric layer. The buried gate structure may be adjacent to (or on the same level as) junction regions (e.g., source/drain (S/D) regions) in an active region of the semiconductor device.

Gate induced drain leakage (GIDL) may increase where the gate electrode and the junction regions overlap. GIDL discharges the stored charges, thereby impeding the operational reliability of the semiconductor device. Moreover, a portion of a buried gate structure of the semiconductor device may be disposed in an isolation region of the semiconductor device, which is referred to as a passing gate. The passing gate may exacerbate the occurrence of GIDL.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate having a first trench and a first gate structure in the first trench. The first gate structure includes a first gate electrode having a first doped region.

Another aspect of the present disclosure provides a semiconductor device. The semiconductor device includes a substrate having a source/drain (S/D) region. The semiconductor device also includes a passing gate having a first doped region. The S/D region and the first doped region are of the same polarity type.

Another aspect of the present disclosure provides a method of manufacturing a semiconductor device. The method includes forming a first trench in a substrate, disposing a first gate electrode in the first trench, and disposing a dummy gate electrode on the first gate electrode in the first trench. The method also includes removing the dummy gate electrode from the first gate electrode and forming a first doped region in the first gate electrode.

Implanting impurity ions or dopants into a gate electrode tailors the doping profile of the junction regions and smooths the doping gradient of the junction regions. Therefore, the additional doped region in the gate electrode reduces the effective electric field and, commensurately, GIDL. Hence, interference between word-lines in different memory cells can be avoided, data retention time can be extended, and the operational reliability of the semiconductor device improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
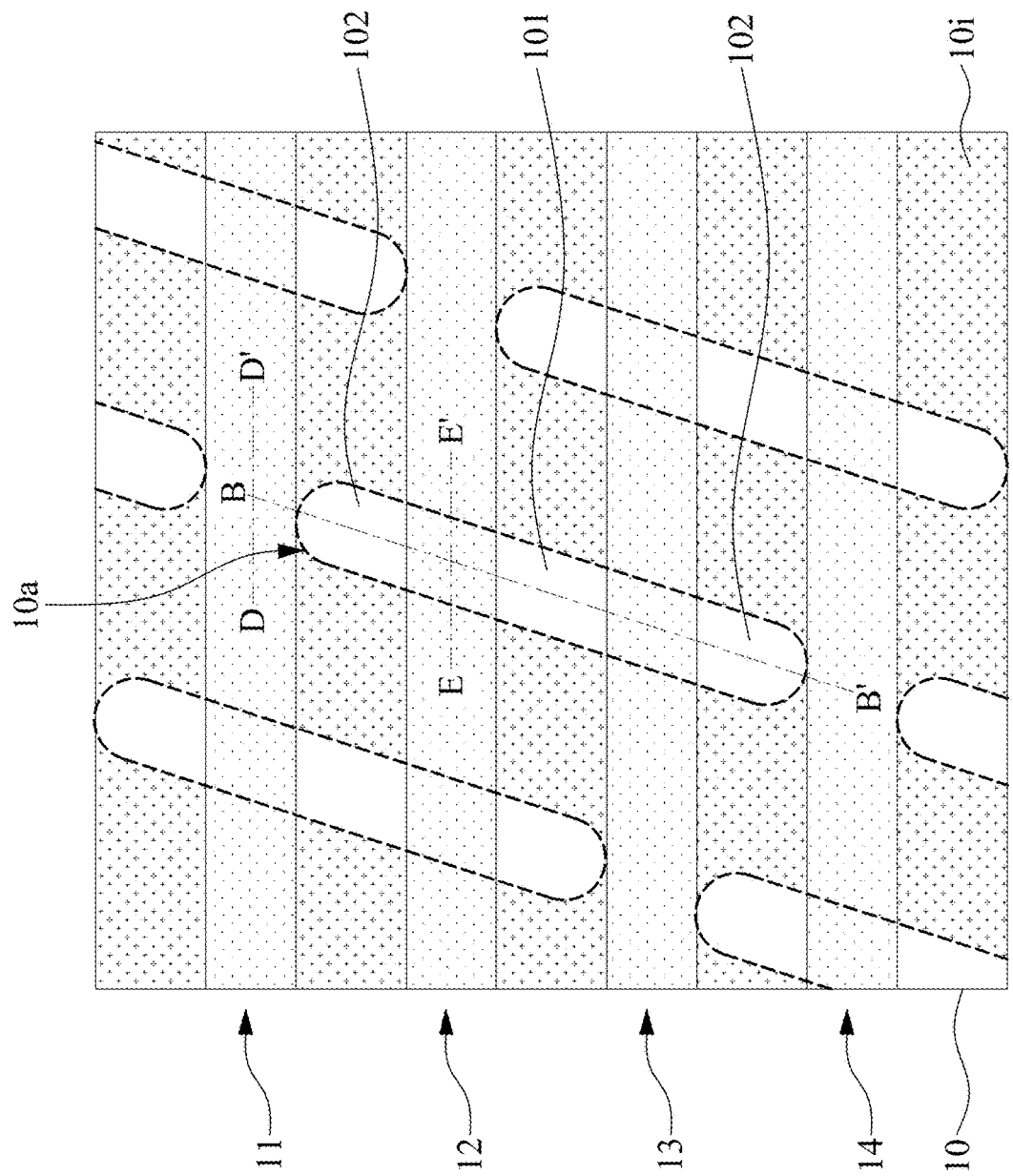
FIG. 1A is a schematic plane view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that features of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic plane view of a semiconductor device 1 in accordance with some embodiments of the present disclosure.

In some embodiments, the semiconductor device 1 may be disposed adjacent to a circuit. For example, the semiconductor device 1 may be disposed adjacent to a memory device such as a dynamic random access memory (DRAM) device or the like.

Referring to FIG. 1A, the semiconductor device 1 may include a plurality of active regions 10a and an isolation region 10i (or an isolation layer) formed on a substrate 10. The active regions 10a may be defined by the isolation region 10i.

The semiconductor device 1 may also include a plurality of gate structures, such as the gate structures 11, 12, 13, and 14. Each active region 10a may cross two gate structures and may be divided into three doped regions by the two gate structures. For example, the active region 10a may be divided into the doped region 101 disposed between the two gate structures 12 and 13 and doped region 102 located at two sides of the doped region 101.

The gate structures 11, 12, 13, and 14 may each extend linearly in any one direction. The gate structures 11, 12, 13, and 14 may each be a buried gate buried in a trench that runs through the active regions 10a and the isolation region 10i. The gate structures 11, 12, 13, and 14 may each include one or more main gate parts (or main gates) buried in the active regions 10a and one or more passing gate parts (or passing gates) buried in the isolation region 10i. For example, FIGS. 1B and 1C (further described as follows) shows a passing gate of the gate structure 11, a main gate of the gate structure 12, a main gate of the gate structure 13, and a passing gate of the gate structure 14. FIG. 1D (further) shows a trench 10t1 (in which structure 11 is disposed) that runs through the isolation region 10i. The portion of the gate structure 11 over the isolation region 10i is a passing gate. FIG. 1E (further described as follows) shows a trench 10t2 (in which the gate structure 12 is disposed) that runs through one of the active regions 10a and the isolation region 10i. The portion of the gate structure 12 over the active region 10a is a main gate.

As used herein, "main gate" refers to a gate configured to receive a voltage to address a memory cell, and "passing gate" refers to a gate configured to receive a voltage to address an adjacent memory cell.

Figure 1B:
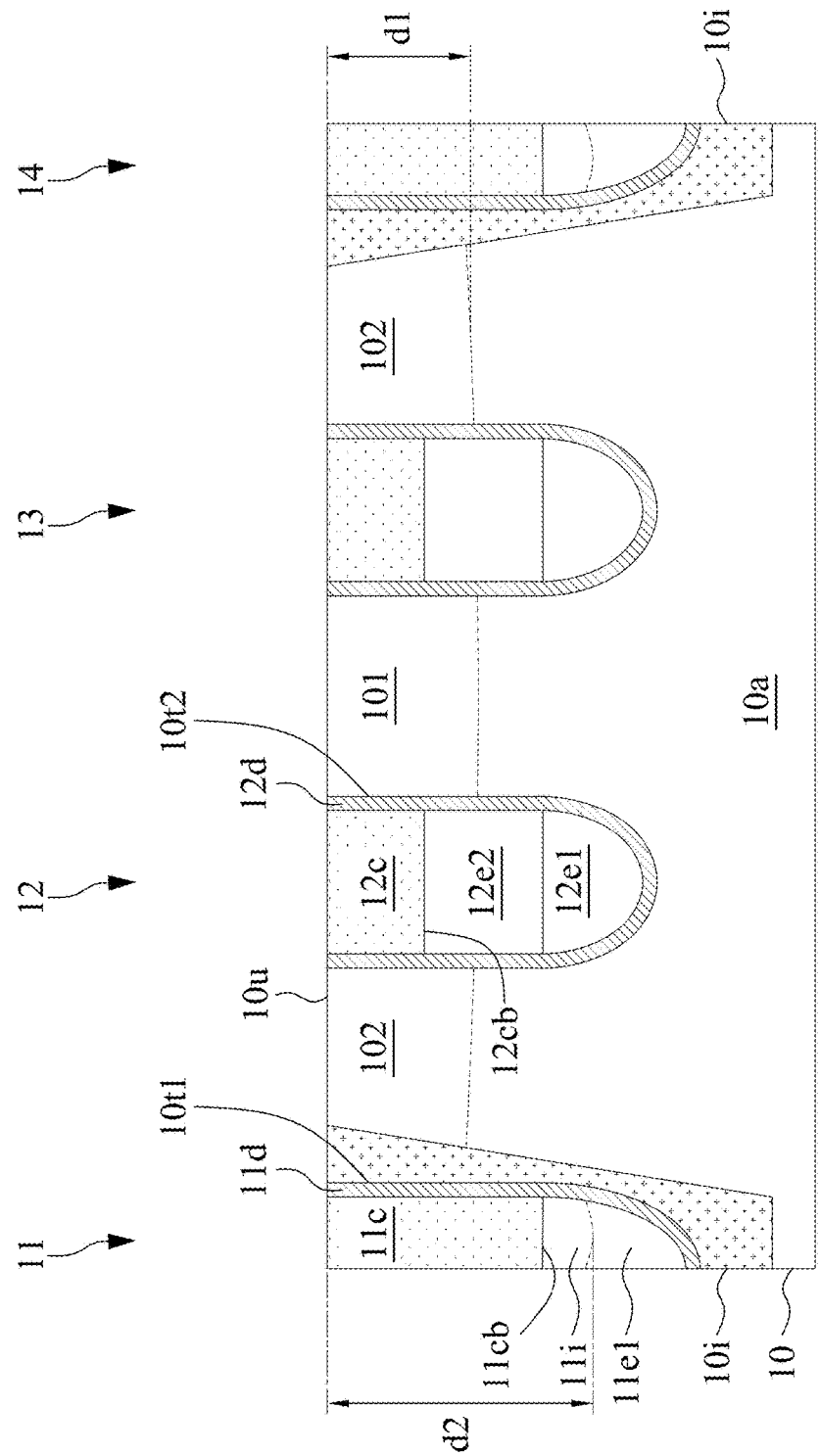
FIG. 1B is a schematic cross-section of the semiconductor device along a B-B' line shown in FIG. 1A.

For example, the gate structure 11 may be a passing gate in one memory cell shown in FIG. 1B, but a main gate in another memory cell. In some embodiments, the gate structure 12 may be a main gate in one memory cell shown in FIG. 1B, but a passing gate in yet another memory cell.

Although the main gate and the passing gate are both presented as parts or portions of the gate structure, both have different structures. For example, as shown in FIG. 1B, the trench 10t1 for the passing gate part of the gate structure 11 and the trench 10t2 for the main gate part of the gate structure 12 have different depths. The trench 10t1 may be deeper than the trench 10t2.

FIG. 1B is a schematic cross-section of the semiconductor device 1 along a B-B' line shown in FIG. 1A.

Referring to FIG. 1B, the semiconductor device 1 may include the substrate 10, and the gate structures 11, 12, 13, and 14 formed in the substrate 10.

The substrate 10 may include a semiconductor substrate. In some embodiments, the substrate 10 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a layered semiconductor such as silicon/silicon germanium, silicon-on-insulator, or silicon germanium-on-insulator.

The active region 10a and the isolation region 10i may be formed in the substrate 10. The active region 10a may be defined by the isolation region 10i. In some embodiments, the isolation region 10i may include shallow trench isolation (STI) structures. The STI structures may include, for example, silicon oxide ($SiO_2$), silicon nitride ($Si_3N_4$), silicon oxynitride ($N_2OSi_2$), silicon nitride oxide ($N_2OSi_2$), etc.

Doped regions 101 and 102 may be formed in the active region 10a. In some embodiments, the doped region 101 and the doped region 102 may be disposed over or proximal to an upper surface 10u (or a top surface) of the substrate 10. The doped region 101 and the doped region 102 may be located on both sides of the trench 10t2.

A channel region may be formed between the doped region 101 and the doped region 102. The channel region may be located below the gate structure 12 and/or the gate structure 13.

In some embodiments, the doped region 101 and the doped region 102 may be implanted with an N-type dopant such as phosphorus (P), arsenic (As), or antimony (Sb). In some other embodiments, the doped region 101 and the doped region 102 may be implanted with a P-type dopant such as boron (B) or indium (In). In some embodiments, the doped region 101 and the doped region 102 may be implanted with dopants or impurity ions of the same polarity type (or the same conductivity type). In some embodiments, the doped region 101 and the doped region 102 may be implanted with dopants or impurity ions of different polarity types (or different conductivity types).

In some embodiments, the channel region may be implanted with a P-type dopant when forming a NMOS transistor device and with an N-type dopant when forming a PMOS transistor device.

Conversely, the doped region 101 and the doped region 102 may be implanted with a P-type dopant when forming a PMOS transistor device and with an N-type dopant when forming a NMOS transistor device.

The boundaries of the doped region 101 and the doped region 102 may be located at a predetermined depth from the upper surface 10u of the substrate 10. The boundaries of the doped region 101 and the doped region 102 may be disposed at substantially the same elevation as the upper surface 10u of the substrate 10 along a vertical axis perpendicular to or traversing the upper surface 10u.

The boundaries of the doped region 101 and the doped region 102 may be spaced apart from the upper surface 10u of the substrate 10 by a distance d1. For example, the distance d1 may be the maximum distance between the doping boundary of the doped region 102 and the upper surface 10u of the substrate 10.

The doped region 102 may contact sidewalls of the isolation region 10i. The doped region 101 and the doped region 102 may contact sidewalls of the trench 10t2. The boundaries of the doped region 101 and the doped region 102 may be higher than the bottom surface of the trench 10t1. Similarly, the boundaries of the doped region 101 and the doped region 102 may be higher than the bottom surface of the trench 10t2.

In some embodiments, the doped region 101 and the doped region 102 may be referred to as source/drain regions. In some embodiments, the doped region 101 may include a bit-line contact region and may electrically connect a bit-line structure (such as the bit-line structure 32 shown in FIG. 3). The doped region 102 may include a storage node junction region and may electrically connect a memory element (such as the memory element 34 shown in FIG. 3).

The trench 10t1 in the isolation region 10i and the trench 10t2 in the active region 10a are spaces in which the gate structures 11 and 12 may be formed. The gate structure 11 in the isolation region 10i may include a passing gate. The gate structure 12 in the active region 10a may include a main gate.

The trench 10t2 may be shallower than the trench 10t1. The bottom of the trenches 10t1 and 10t2 may each have a curvature as shown in the embodiment of FIG. 1B. However, in some other embodiments, the bottom of the trenches 10t1 and 10t2 may be flat or have other shapes.

The gate structure 12 may include a dielectric layer 12d, gate electrodes 12e1, 12e2, and a capping layer 12c.

The dielectric layer 12d may be conformally formed on the bottom surface and sidewall of the trench 10t2. The dielectric layer 12d may surround or cover a part of the gate electrode 12e1. The dielectric layer 12d may surround or cover a part of the gate electrode 12e2. The dielectric layer 12d may separate the gate electrode 12e1 from the substrate 10. The dielectric layer 12d may separate the gate electrode 12e2 from the substrate 10.

A part (e.g., a bottom or a base portion) of the dielectric layer 12d may be disposed between the gate electrode 12e1 and the substrate 10. A part (e.g., a sidewall or an extending portion) of the dielectric layer 12d may be disposed between the gate electrode 12e2 and the substrate 10.

In some embodiments, the dielectric layer 12d may include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant higher than that of silicon dioxide ($SiO_2$), or a dielectric material having a dielectric constant higher than about 3.9. In some embodiments, the dielectric layer 12d may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

The gate electrode 12e1 may be disposed on the dielectric layer 12d and spaced apart from the substrate 10 by the dielectric layer 12d. The gate electrode 12e1 may be surrounded or covered by the dielectric layer 12d. The gate electrode 12e1 may also be referred to as a lower gate electrode with respect to the gate electrode 12e2.

In some embodiments, the gate electrode 12e1 may include a single layer of metal, metal composite, or layers of conductive materials. In some embodiments, the gate electrode 12e1 may include a metal. For example, the gate electrode 12e1 may include titanium (Ti), titanium nitride (TiN), tantalum (Ta), tantalum nitride (TaN), tungsten (W), tungsten nitride (WN), a stack thereof or a combination thereof.

The gate electrode 12e2 may be disposed on the gate electrode 12e1. The gate electrode 12e2 may be spaced apart from the substrate 10 by the dielectric layer 12d. The gate electrode 12e2 may also be referred to as an upper gate electrode with respect to the gate electrode 12e1.

A lower surface of the gate electrode 12e2 may be located lower than the boundary of the doped region 102. The gate electrode 12e2 and the doped region 102 may be at least partially overlapping in a direction substantially parallel to the upper surface 10u of the substrate 10.

In some embodiments, the gate electrode 12e2 may include a single layer of metal, metal composite or layers of conductive materials. In some embodiments, the gate electrode 12e2 may include polycrystalline silicon (poly-Si), titanium nitride (TiN), tungsten nitride (WN), or the like.

In some embodiments, a width of the gate electrode 12e1 may be substantially equal to a width of the gate electrode 12e2. For example, the greatest width (or the maximum width) of the gate electrode 12e1 may be substantially equal to the greatest width of the gate electrode 12e2.

In some embodiments, the gate electrodes 12e1 and 12e2 may function as word-lines. For example, the gate electrodes 12e1 and 12e2 may be used with bit-lines (such as the bit-line structure 32 shown in FIG. 3) to address memory cells. For example, the gate electrode 12e2 may function as a gate electrode of a transistor in a memory cell. The doped region 102 and the doped region 101 may function as a drain region and a source region of the transistor. The doped region 102 may be coupled to a capacitor or a memory element (such as the memory element 34 shown in FIG. 3) and the doped region 101 may be coupled to a bit-line (such as the bit-line structure 32 shown in FIG. 3). The transistor may retain charge in the capacitor.

In some embodiments, the gate electrode 12e2 may have a low work function. In some embodiments, the gate electrode 12e1 may have a high work function, specifically one exceeding a mid-gap work function of silicon. Low work function refers here to a work function lower than the mid-gap work function of silicon. Specifically, the high work function may be higher than 4.5 eV, and the low work function may be lower than 4.5 eV.

The capping layer 12c may be disposed on the gate electrode 12e2. The capping layer 12c may be spaced apart from the substrate 10 by the dielectric layer 12d.

The capping layer 12c may be surrounded or covered by the dielectric layer 12d. The capping layer 12c may contact the extending portion of the dielectric layer 12d. The capping layer 12c may serve to protect the gate electrode 12e2. The capping layer 12c may have a surface substantially coplanar with the upper surface 10u of the substrate 10.

In some embodiments, a width of the gate electrode 12e1 may be substantially equal to a width of the capping layer 12c. For example, the greatest width of the gate electrode 12e1 may be substantially equal to the greatest width of the capping layer 12c.

In some embodiments, a width of the gate electrode 12e2 may be substantially equal to a width of the capping layer 12c. For example, the greatest width of the gate electrode 12e2 may be substantially equal to the greatest width of the capping layer 12c.

In some embodiments, the capping layer 12c may include a dielectric material, such as silicon oxide ($SiO_2$), silicon nitride ($Si_3N_4$), silicon oxynitride ($N_2OSi_2$), and silicon nitride oxide ($N_2OSi_2$). In some embodiments, the capping layer 12c may include a silicon nitride liner and a spin-on-dielectric (SOD) material.

The gate structure 11 may include a dielectric layer 11d, a gate electrode 11e1, and a capping layer 11c. The gate structure 11 has a structure similar to the structure of the gate structure 12, except that the gate structure 11 is disposed in the isolation region 10i and the gate structure 11 includes a single doped gate electrode.

The gate electrode 11e1 may be the only gate electrode of the gate structure 11. In some embodiments, the gate structure 12 includes two gate electrodes and the gate structure 11 includes one gate electrode.

As shown, a bottom surface 11cb of the capping layer 11c and a bottom surface 12cb of the capping layer 12c may be disposed at different elevations with respect to the upper surface 10u of the substrate 10 along a vertical axis perpendicular to or traversing the upper surface 10u. A thickness of the capping layer 11c may be greater than a thickness of the capping layer 12c.

The gate electrode 11e1 may be disposed on the dielectric layer 11d and spaced apart from the substrate 10 by the dielectric layer 11d. The gate electrode 11e1 may be surrounded or covered by the dielectric layer 11d. An upper surface of the gate electrode 11e1 may contact the capping layer 11c. For example, the capping layer 11c may directly contact the gate electrode 11e1.

In some embodiments, the gate electrode 11e1 may include a single layer of metal, metal composite, or layers of conductive materials. In some embodiments, the gate electrode 11e1 may include a metal. For example, the gate electrode 11e1 may include titanium (Ti), titanium nitride (TiN), tantalum (Ta), tantalum nitride (TaN), tungsten (W), tungsten nitride (WN), a stack thereof or a combination thereof. In some embodiments, the gate electrode 11e1 and the gate electrode 12e1 may include the same material. In some embodiments, the gate electrode 11e1 and the gate electrode 12e1 may be formed in the same operation.

In some embodiments, the gate electrode 11e1 and the doped region 102 may be non-overlapping in a direction substantially parallel to the upper surface 10u of the substrate 10.

The gate electrode 11e1 may include a doped region 11i adjacent to the upper surface of the gate electrode 11e1. For example, the doped region 11i may be adjacent to the bottom surface 11cb of the capping layer 11c. For example, the doped region 11i may directly contact the capping layer 11c. For example, the doped region 11e may be defined in the gate electrode 11e1 and proximal to the top surface thereof.

A boundary of the doped region 11e may be spaced apart from the upper surface 10u of the substrate 10 by a distance d2. For example, the distance d2 may be the maximum distance between the doping boundary of the doped region 11i and the upper surface 10u of the substrate 10.

In some embodiments, the doping boundary of the doped region 11i and the doping boundary of the doped region 102 may be disposed at different elevations with respect to the upper surface 10u of the substrate 10 along a vertical axis perpendicular to or traversing the upper surface 10u. For example, the distance d2 may exceed the distance d1.

In some embodiments, the doped region 11i may be implanted with an N-type dopant. In some embodiments, the doped region 11i may be implanted with phosphorus (P) and arsenic (As) containing ions such as, but not limited to, $P^+$, $P^{2+}$, $As^+$ and $As^{2+}$. In some embodiments, the doped region 11i may be implanted with a P-type dopant. In some embodiments, the doped region 11i may be implanted with boron (B) containing ions such as, but not limited to $B^+$, $B^{2+}$, $BF^+$, $BF^{2+}$ and $BF^{3+}$.

In some embodiments, the dopants may locate within the doped region 11i. In some embodiments, the dopants may accumulate at the doping boundary of the doped region 11i. In some embodiments, the doping boundary of the doped region 11i may be a grain boundary between the doped region 11i and the gate electrode 11e1. In some embodiments, the doped region 11i and the gate electrode 11e1 may have different crystallinities, densities and/or microstructures. In some embodiments, the doped region 11$i$ may be analyzed or identified by an elementary analysis, X-ray diffraction, mass spectrometry or the like.

In some embodiments, the doped region 11$i$ may also be defined in the dielectric layer 11$d$. For example, dopants may also be found in the dielectric layer 11$d$.

In some embodiments, the doped region 11$i$ and the doped region 102 may be implanted with dopants or impurity ions of the same polarity type (or the same conductivity type). In some other embodiments, the doped region 11$i$ and the doped region 102 may be implanted with dopants or impurity ions of different polarity types (or different conductivity types).

In some embodiments, the doped region 11$i$ may be configured to tailor the doping profile of the junction regions (such as the doped region 101 and/or the doped region 102). In some embodiments, the doped region 11$i$ may be configured to smooth the doping gradient of the junction regions. In some embodiments, the gate electrode 11$e$1 may be implanted with more than one kind of dopant to produce desired electrical characteristics. For example, dopants of different ion species, different molecular masses, different valence electrons and/or different concentrations may be implanted into the gate electrode 11$e$1.

For example, a first kind of dopant may be implanted into a first location (or depth) in the gate electrode 11$e$1 and a second kind of dopant may be implanted into a second location (or depth) in the gate electrode 11$e$1. In some embodiments, the doped region 11$i$ may include two layers of different dopants. In some embodiments, the doped region 11$i$ may include three or more layers of different dopants.

Each additional implant may have an implant energy and an implant angle. In some embodiments, the implants may be performed in a sequence of decreasing implant energy to prevent dopant displacement ("knocking in").

In some embodiments, the passing gates (such as the gate structures 11 and 14) may be implanted with dopants or impurity ions of the same polarity type (or the same conductivity type).

In some other embodiments, the gate structure 11 and the gate structure 14 may include be implanted with dopants or impurity ions of different polarity types (or different conductivity types).

Figure 1C:
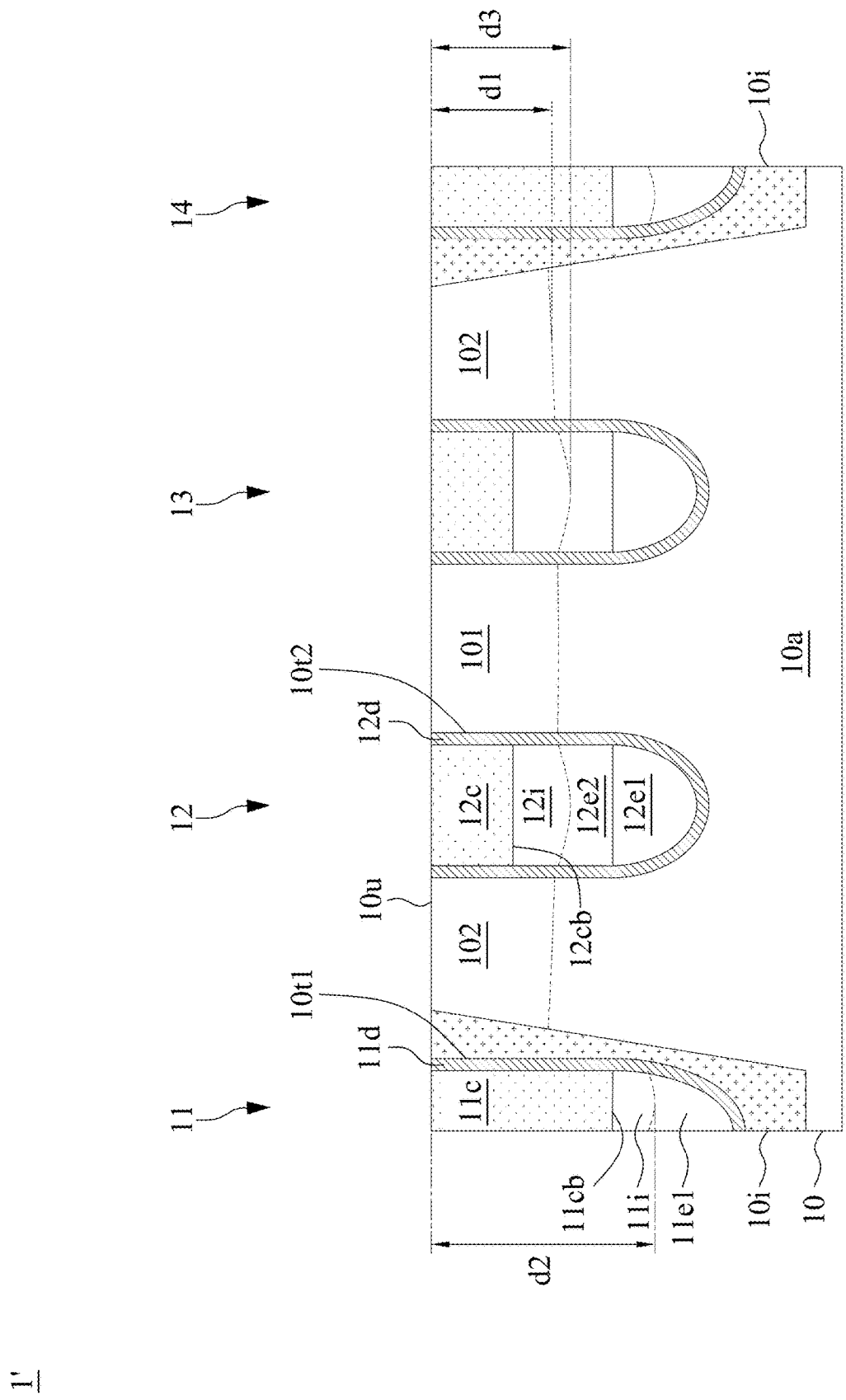
FIG. 1C is a schematic cross-section of a semiconductor device in accordance with some embodiments of the present disclosure.
Figure 1D:
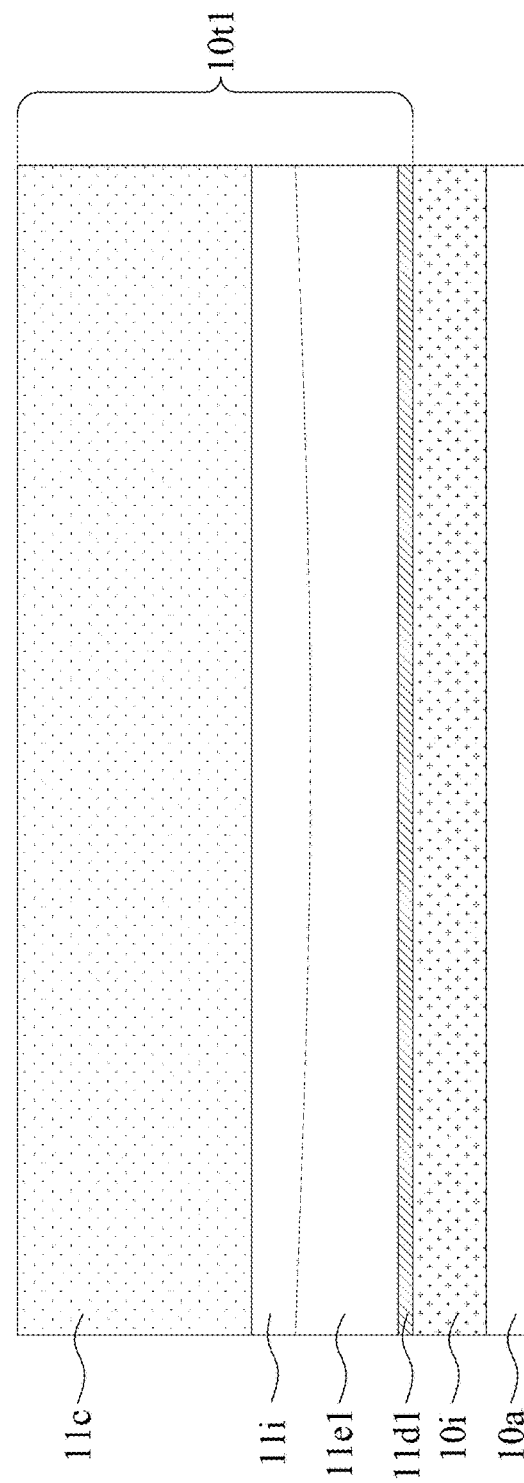
FIG. 1D is a schematic cross-section of the semiconductor device along a D-D' line shown in FIG. 1A.
Figure 1E:
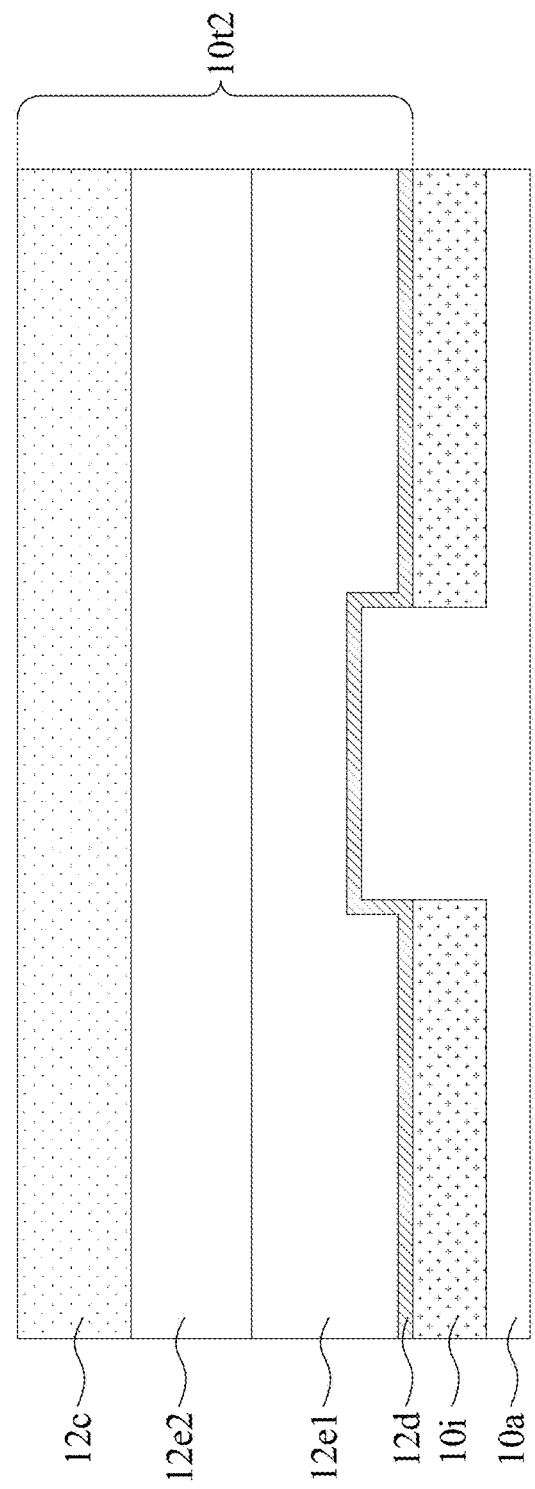
FIG. 1E is a schematic cross-section of the semiconductor device along an E-E' line shown in FIG. 1A.

FIG. 1C is a schematic cross-section of a semiconductor device 1' in accordance with some embodiments of the present disclosure. The semiconductor device 1' of FIG. 1C is similar to the semiconductor device 1 of FIG. 1B, except for the differences described as follows.

The gate electrode 12$e$2 of semiconductor device 1' may include a doped region 12$i$ adjacent to the upper surface of the gate electrode 12$e$2. For example, the doped region 12$i$ may be adjacent to the bottom surface 12$cb$ of the capping layer 12$c$. For example, the doped region 12$i$ may directly contact the capping layer 12$c$.

A boundary of the doped region 12$i$ may be spaced apart from the upper surface 10$u$ of the substrate 10 by a distance d3. For example, the distance d3 may be the maximum distance between the doping boundary of the doped region 12$i$ and the upper surface 10$u$ of the substrate 10.

In some embodiments, the doping boundary of the doped region 12$i$ and the doping boundary of the doped region 102 may be disposed at substantially the same elevation as the upper surface 10$u$ of the substrate 10 along a vertical axis perpendicular to or traversing the upper surface 10$u$. For example, the distance d1 may be substantially equal to the distance d3. In some embodiments, the distance d1 may be greater than the distance d3. In some embodiments, the distance d1 may be less than the distance d3.

In some embodiments, the doping boundary of the doped region 12$i$ and the doping boundary of the doped region 11$i$ may be disposed at different elevations with respect to the upper surface 10$u$ of the substrate 10 along a vertical axis perpendicular to or traversing the upper surface 10$u$. For example, the distance d2 may exceed the distance d3.

In some embodiments, the doped region 12$i$ may be implanted with an N-type dopant. In some embodiments, the doped region 12$i$ may be implanted with phosphorus (P) and arsenic (As) containing ions such as, but not limited to, $P^+$, $P^{2+}$, $As^+$ and $As^{2+}$. In some embodiments, the doped region 12$i$ may be implanted with a P-type dopant. In some embodiments, the doped region 12$i$ may be implanted with boron (B) containing ions such as, but not limited to $B^+$, $B^{2+}$, $BF^+$, $BF^{2+}$, and $BF^{3+}$.

In some embodiments, the dopants may locate within the doped region 12$i$. In some embodiments, the dopants may accumulate at the doping boundary of the doped region 12$i$. In some embodiments, the doping boundary of the doped region 12$i$ may be a grain boundary between the doped region 12$i$ and the gate electrode 12$e$2. In some embodiments, the doped region 12$i$ and the gate electrode 12$e$2 may have different crystallinities, densities and/or microstructures. In some embodiments, the doped region 12$i$ may be analyzed or identified by an elementary analysis, X-ray diffraction, mass spectrometry or the like.

In some embodiments, the doped region 12$i$ and the doped region 102 may be implanted with dopants or impurity ions of the same polarity type (or the same conductivity type). In some other embodiments, the doped region 12$i$ and the doped region 102 may be implanted with dopants or impurity ions of different polarity types (or different conductivity types).

In some embodiments, the doping boundary of the doped region 12$i$ and the doping boundary of the doped region 102 may be substantially continuous. For example, the doping boundary may smoothly extend from the substrate 10 to the gate electrode 12$e$2. In some embodiments, the doped region 12$i$ may also be defined in the dielectric layer 12$d$. For example, dopants may also be found in the dielectric layer 12$d$.

The doped region 12$i$ and the doped region 102 may be at least partially overlapping in a direction substantially parallel to the upper surface 10$u$ of the substrate 10.

In some embodiments, the doped region 12$i$ may be configured to tailor the doping profile of the junction regions (such as the doped region 101 and/or the doped region 102).

Similarly, in some embodiments, the doped region 12$i$ and the doped region 11$i$ may be implanted with dopants or impurity ions of the same polarity type (or the same conductivity type). In some other embodiments, the doped region 12$i$ and the doped region 11$i$ may be implanted with dopants or impurity ions of different polarity types (or different conductivity types).

In some embodiments, the doped region 12$i$ and the doped region 11$i$ may have different dopant concentrations. For example, the dopant concentration of the doped region 12$i$ may exceed the dopant concentration of the doped region 11$i$. For example, the dopant concentration of the doped region 11$i$ may exceed the dopant concentration of the doped region 12$i$.

FIG. 1D is a schematic cross-section of the semiconductor device along a D-D' line shown in FIG. 1A.

Referring to FIG. 1D, the trench 10$t$1 extends through the isolation region 10$i$. The doped region 11$i$ may run through the trench 10t1. In some embodiments, the doped region 11i may be linear or have a line shape. For example, from the top view in FIG. 1A, the doped region 11i may locate at a surface area of the gate structure 11. For example, from the top view in FIG. 1A, the doped region 11i may extend linearly in any one direction. For example, from the top view in FIG. 1A, the doped region 11i may run through the active regions 10a and the isolation region 10i.

FIG. 1E is a schematic cross-section of the semiconductor device along an E-E' line shown in FIG. 1A.

Referring to FIG. 1E, the trench 10t2 extends through one of the active regions 10a and the isolation region 10i. The trench 10t2 may have a fin structure in which the active region 10a protrudes more than the isolation region 10i. In other words, a depth of the passing gate, which runs across the isolation region 10i, may exceed a depth of the main gate, which runs across active region 10a. Accordingly, the trench for the gate structure 12 has different depths for a main gate region and a passing gate region.

The fin structure may increase the channel width and improve the electrical characteristics. In some embodiments, the fin structure may be omitted.

Figure 2A:
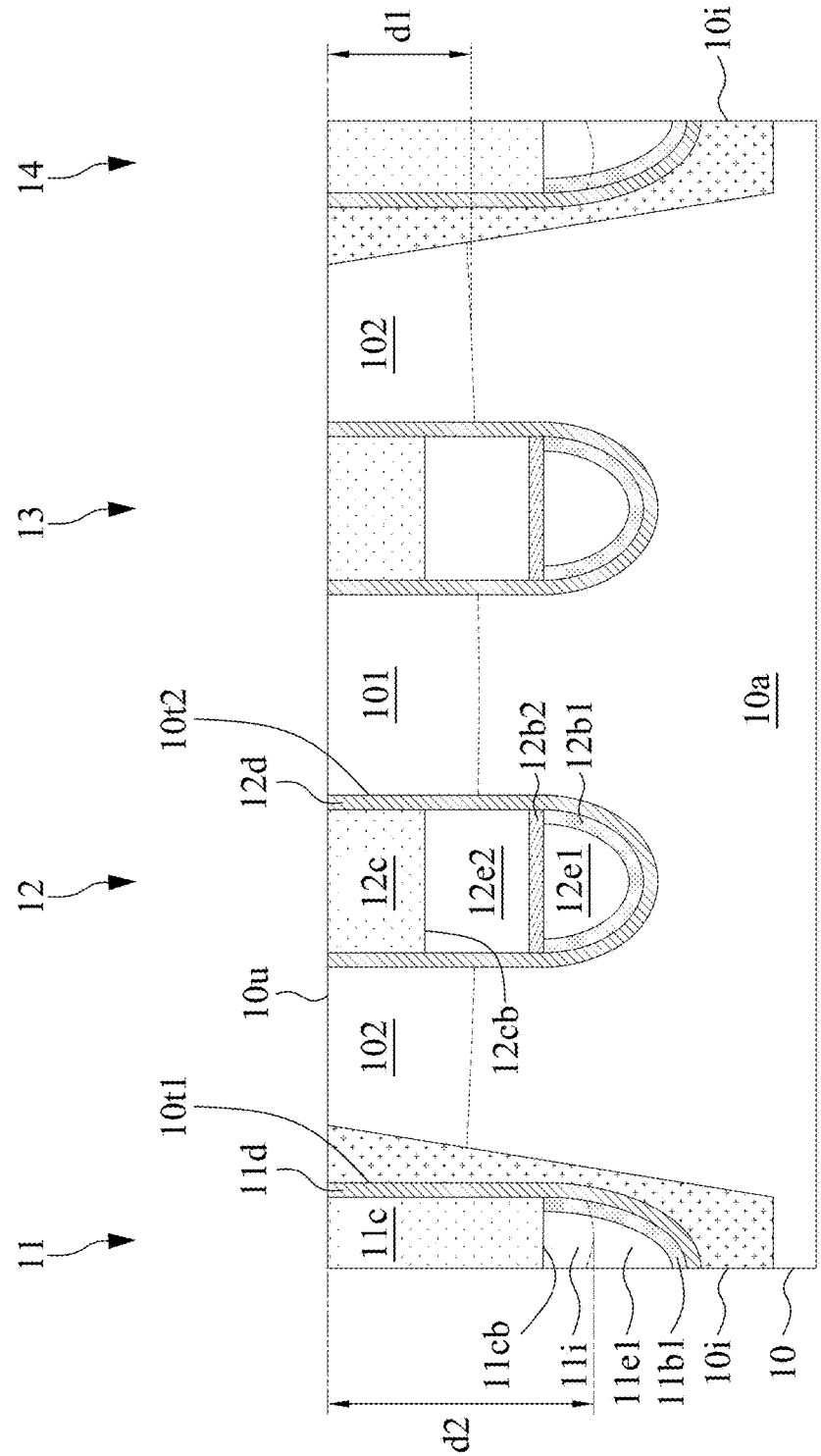
FIG. 2A is a schematic cross-section of a semiconductor device in accordance with some embodiments of the present disclosure.

FIG. 2A is a schematic cross-section of a semiconductor device 2 in accordance with some embodiments of the present disclosure. The semiconductor device 2 of FIG. 2A is similar to the semiconductor device 1 of FIG. 1B, except for the differences described as follows.

The gate structure 11 of the semiconductor device 2 further includes a barrier layer 11b1 disposed between the substrate 10 and the gate electrode 11e1. The barrier layer 11b1 may be conformally formed on a surface of the trench 10t1. The doped region 10i may be defined in the gate electrode 11e1 and the barrier layer 11b1. For example, a doping profile of the doped region 10i may continuously and smoothly exist in the gate electrode 11e1 and the barrier layer 11b1. For example, dopants may be found in the barrier layer 11b1.

The gate structure 12 of the semiconductor device 2 further includes a barrier layer 12b1 and a barrier layer 12b2. The barrier layer 12b1 is disposed between the substrate 10 and the gate electrode 12e1. The barrier layer 12b1 may be conformally formed on a surface of the trench 10t2. The barrier layer 12b2 is disposed between the gate electrode 12e1 and the gate electrode 12e2.

In some embodiments, the barrier layer 11b1 and the barrier layer 12b1 may each include a metal. The barrier layer 11b1 and the barrier layer 12b1 may each include metal nitride. The barrier layer 11b1 and the barrier layer 12b1 may each include titanium nitride (TiN) or tantalum nitride (TaN).

The barrier layers 12b1 and 12b2 may be formed of the same material or different materials. In some embodiments, the barrier layer 12b2 may include a metal. The barrier layer 12b2 may include metal nitride. The barrier layer 12b2 may include titanium nitride (TiN) or tantalum nitride (TaN), tungsten nitride (WN) or combinations thereof.

Figure 2B:
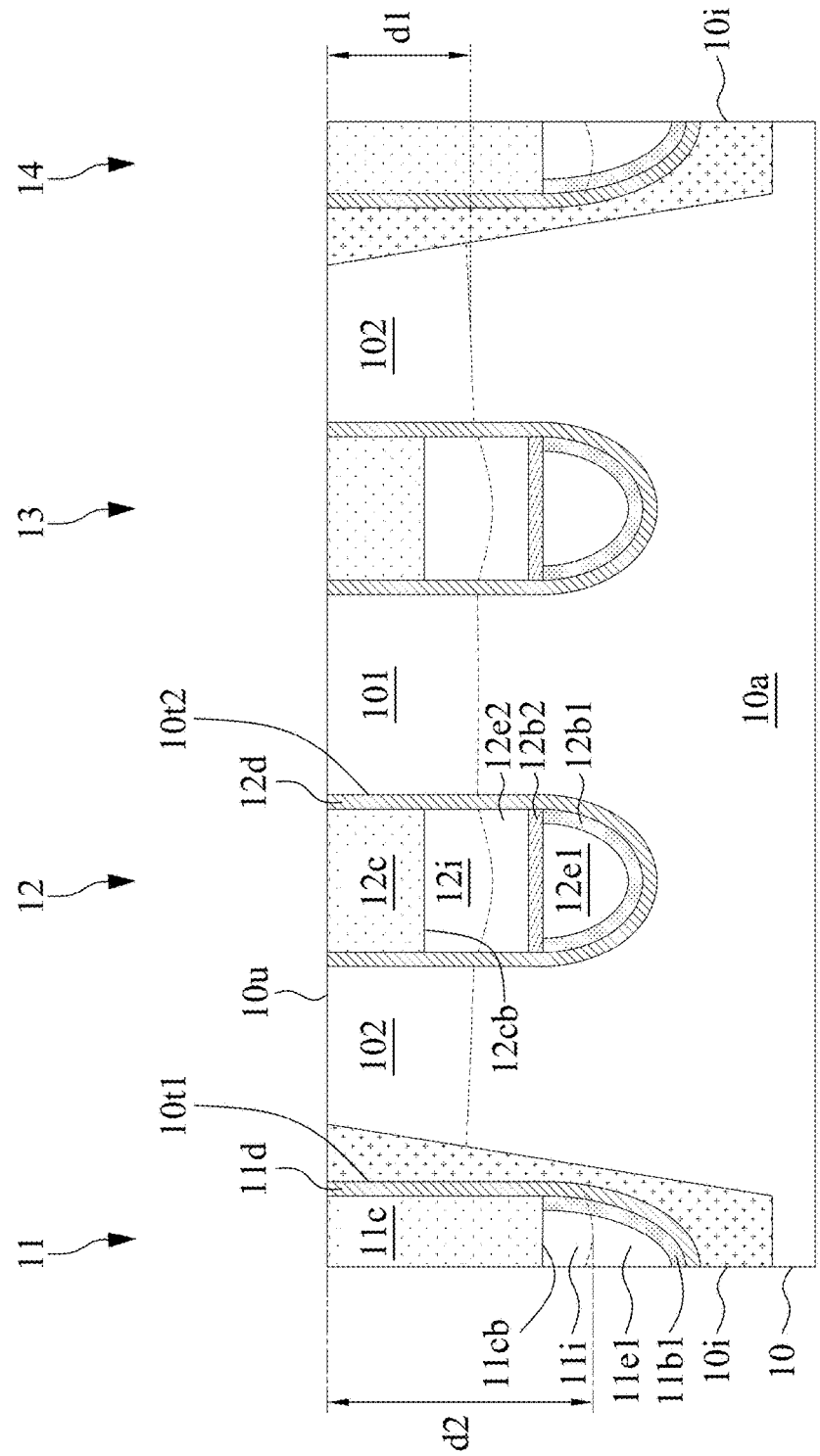
FIG. 2B is a schematic cross-section of a semiconductor device in accordance with some embodiments of the present disclosure.

FIG. 2B is a schematic cross-section of a semiconductor device 2' in accordance with some embodiments of the present disclosure. The semiconductor device 2' of FIG. 2B is similar to the semiconductor device 2 of FIG. 2A, except for the differences described as follows.

The gate electrode 12e2 of semiconductor device 2' may include a doped region 12i adjacent to the upper surface of the gate electrode 12e2. For example, the doped region 12i may be adjacent to the bottom surface 12cb of the capping layer 12c.

Figure 3:
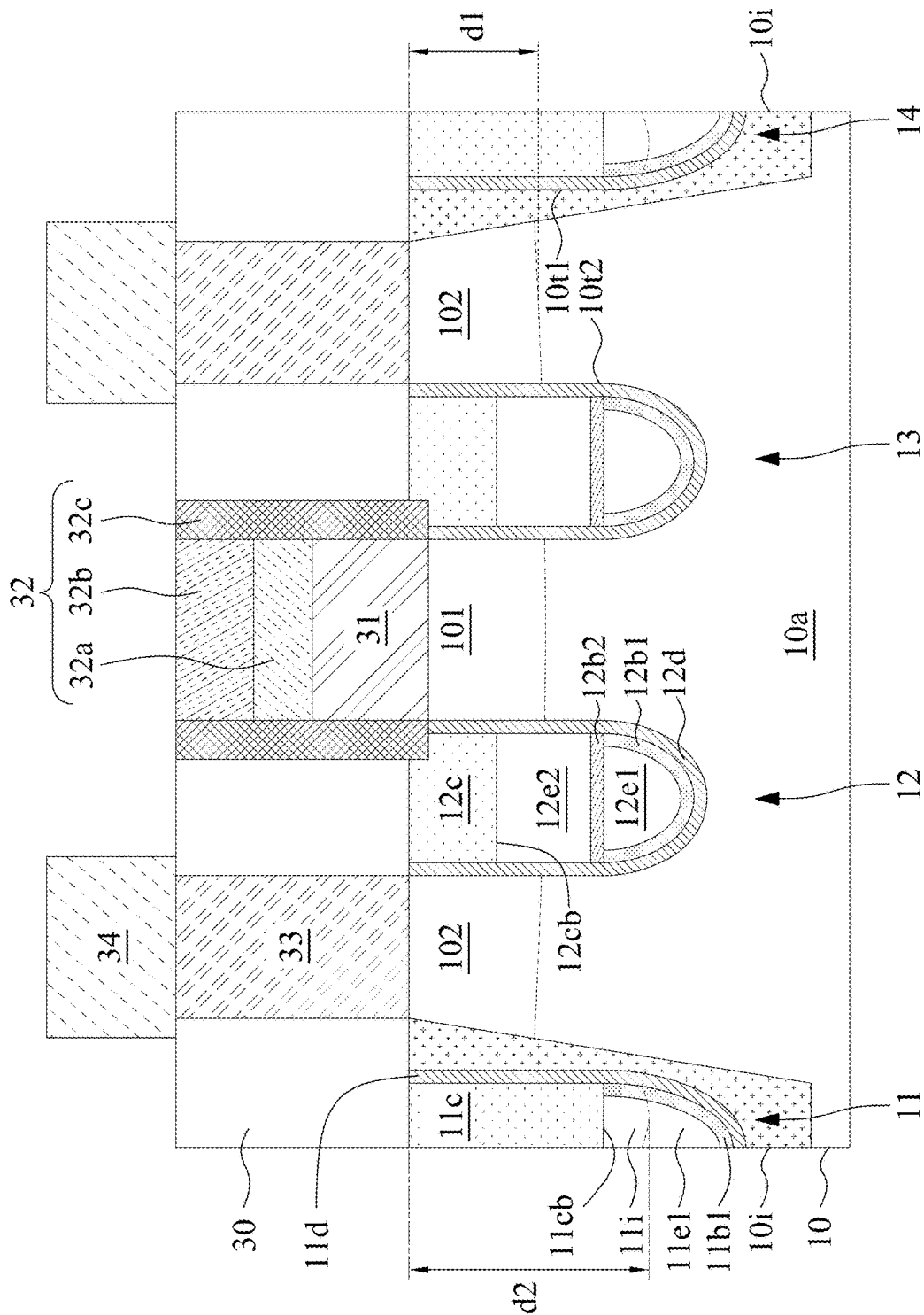
FIG. 3 is a schematic cross-section of a semiconductor device in accordance with some embodiments of the present disclosure.

FIG. 3 is a schematic cross-section of a semiconductor device 3 in accordance with some embodiments of the present disclosure. The semiconductor device 3 of FIG. 3 is similar to the semiconductor device 2' of FIG. 2B, except for the differences described as follows.

The semiconductor device 3 may further include an isolation layer 30, contact plugs 31, 33, a bit-line structure 32, and a memory element 34.

The isolation layer 30 may be a single layer or a multi-layer. The isolation layer 30 may include silicon oxide ($SiO_2$), silicon nitride ($Si_3N_4$), silicon oxynitride ($N_2OSi_2$), silicon nitride oxide ($N_2OSi_2$), etc. The isolation layer 30 may serve to isolate adjacent contact plugs 33.

The contact plug 31 may electrically connect the bit-line structure 32 and the doped region 101. The bit-line structure 32 may include a bit-line 32a, a bit line hard mask layer 32b and a spacer 32c. The bit-line 32a may include at least one material selected from among a polysilicon (poly-Si), a metal silicide, a metal nitride, and a metal. The bit line hard mask layer 32b may include a silicon oxide or a silicon nitride. The spacer 32c may include a dielectric material.

The contact plug 33 may electrically connect the memory element 34 and the doped region 102.

In some embodiments, the contact plugs 31 and 33 may include a suitable conductive material. For example, the contact plugs 31 and 33 may include tungsten (W), copper (Cu), aluminum (Al), silver (Ag), an alloy thereof, or a combination thereof.

The memory element 34 may be a capacitor. Accordingly, the memory element 34 may include a storage node which contacts the contact plug 33. The storage node may be cylindrical or columnar. A capacitor dielectric layer may be formed on the surface of the storage node.

As the DRAM device becomes more highly integrated, it becomes more difficult to isolate a main gate (such as an electrode of the gate structure 12) in a memory cell from a passing gate (such as an electrode of the gate structure 11) in an adjacent memory cell. For example, when a passing gate is turned on, an inversion layer may be created that may extend the source/drain junction, creating an internal electric field. GIDL may be accelerated by the internal electric field.

Implanting impurity ions or dopants into a gate electrode (such as the gate electrode 11e1 and/or the gate electrode 12e2) tailors the doping profile of the junction regions (such as the doped region 101 and/or the doped region 102) and smooths the doping gradient of the junction regions. Therefore, the additional doped region in the gate electrode reduces the effective electric field and consequently reduces GIDL. Hence, interference between word-lines in different memory cells can be avoided. Data retention time can be extended, and the operational reliability of the semiconductor device improved.

FIGS. 4A, 4B, 4C, 4D, 4E, 4F, 4G, 4H, 4I, 4J, 4K, 4L, 4M, 4N, and 4O illustrate stages of a method of manufacturing a semiconductor device in accordance with some embodiments of the present disclosure. At least some of these figures have been simplified for a better understanding of the aspects of the present disclosure. In some embodiments, the semiconductor device 3 in FIG. 3 may be manufactured by the operations described as follows with respect to FIGS. 4A, 4B, 4C, 4D, 4E, 4F, 4G, 4H, 4I, 4J, 4K, 4L, 4M, 4N, and 4O.

Figure 4A:
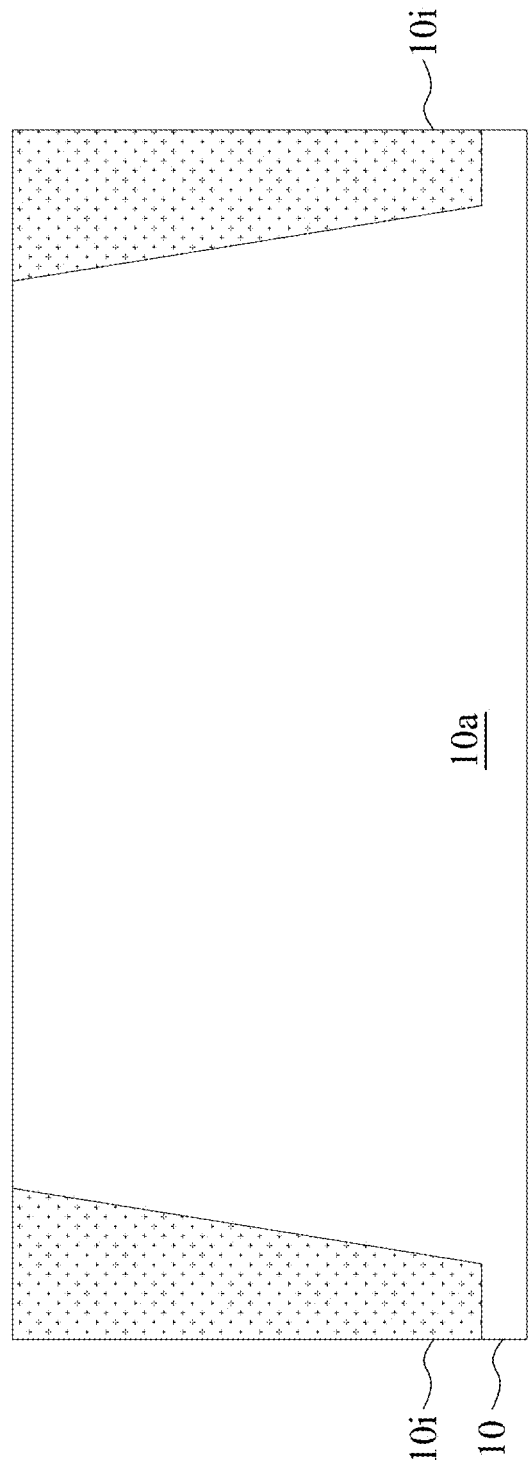
FIG. 4A illustrates one or more stages of a method of manufacturing a semiconductor device in accordance with some embodiments of the present disclosure.

As shown in FIG. 4A, the isolation region 10i is formed in the substrate 10. The active region 10a is defined by the isolation region 10i. The isolation region 10i may be formed through an STI (shallow trench isolation) process. For example, after a pad layer (not shown) is formed on the substrate 10, the pad layer and the substrate 10 are etched using an isolation mask (not shown) to define an isolation trench. The isolation trench is filled with a dielectric material, and accordingly, the isolation region 10*i* is formed.

A wall oxide, a liner, and a gap-fill dielectric may be sequentially formed as the isolation region 10*i*. The liner may be formed by stacking silicon oxide ($SiO_2$) and silicon nitride ($Si_3N_4$). The gap-fill dielectric may include a SOD material. In another embodiment of the present invention, in the isolation region 10*i*, silicon nitride may be used as the gap-fill dielectric. The isolation trench may be filled with a dielectric material through a chemical vapor deposition (CVD) process. Also, a planarization process such as chemical-mechanical polishing (CMP) may be additionally performed.

Figure 4B:
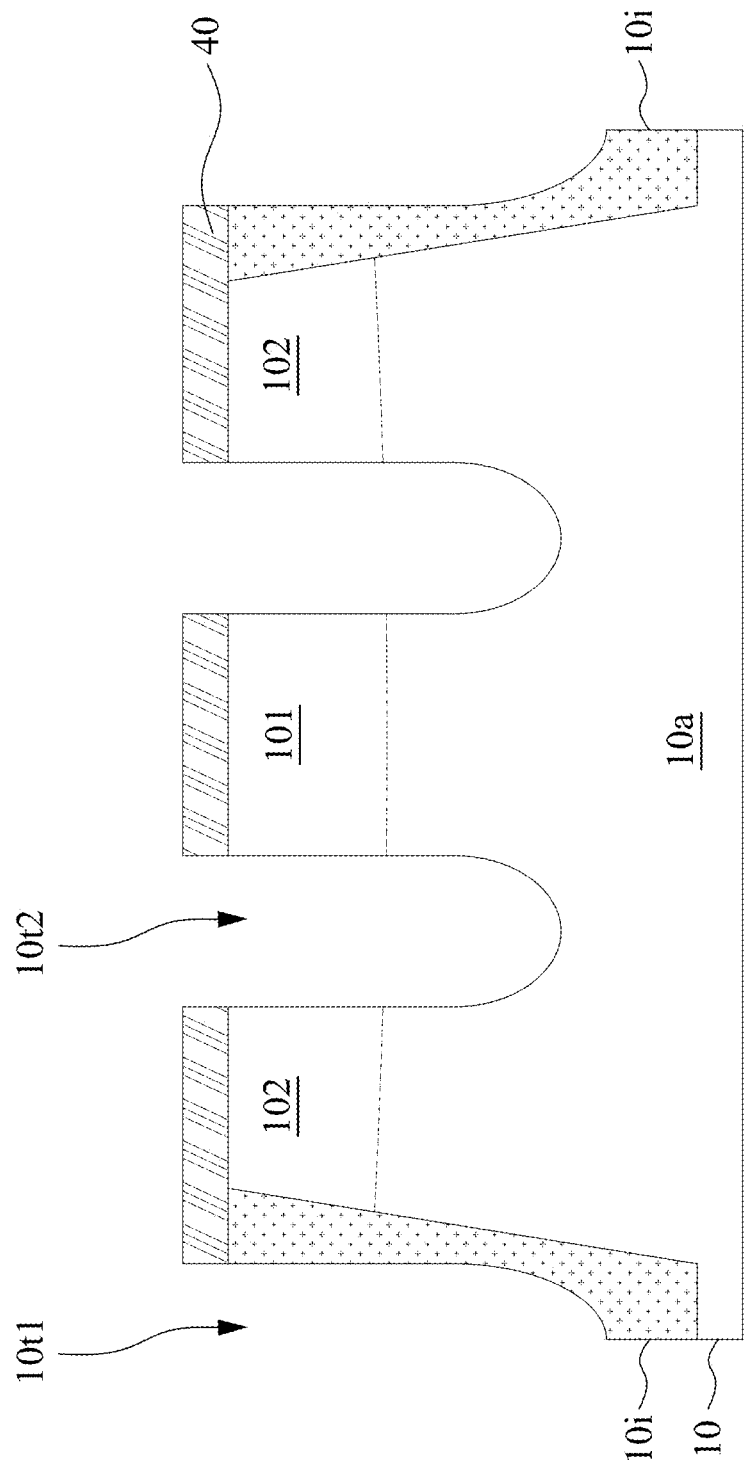
FIG. 4B illustrates one or more stages of a method of manufacturing a semiconductor device in accordance with some embodiments of the present disclosure.

Referring to FIG. 4B, a plurality of trenches 10*t*1 and 10*t*2 may then be formed in the substrate 10. Each of the trenches 10*t*1 and 10*t*2 may linearly cross the active region 10*a* and the isolation region 10*i*. Each of the trenches 10*t*1 and 10*t*2 may be formed by etching the substrate 10 using a hard mask layer 40 as an etch mask. The hard mask layer 40 may be formed on the substrate 10, and have linear openings. The hard mask layer 40 may be formed of a material having an etch selectivity to the substrate 10. Each of the trenches 10*t*1 and 10*t*2 may be formed to be shallower than the isolation trench. In some embodiments, the bottom edge of each of the trenches 10*t*1 and 10*t*2 may have a curvature.

The active region 10*a* and the isolation region 10*i* may be simultaneously etched to form the trenches 10*t*1 and 10*t*2. In some embodiments, the isolation region 10*i* is more deeply etched than the active region 10*a* due to etch selectivity between the active region 10*a* and the isolation region 10*i*. Therefore, the gate trench may have a fin structure in which the active region 10*a* protrudes beyond the isolation region 10*i* in the gate trench.

Figure 4C:
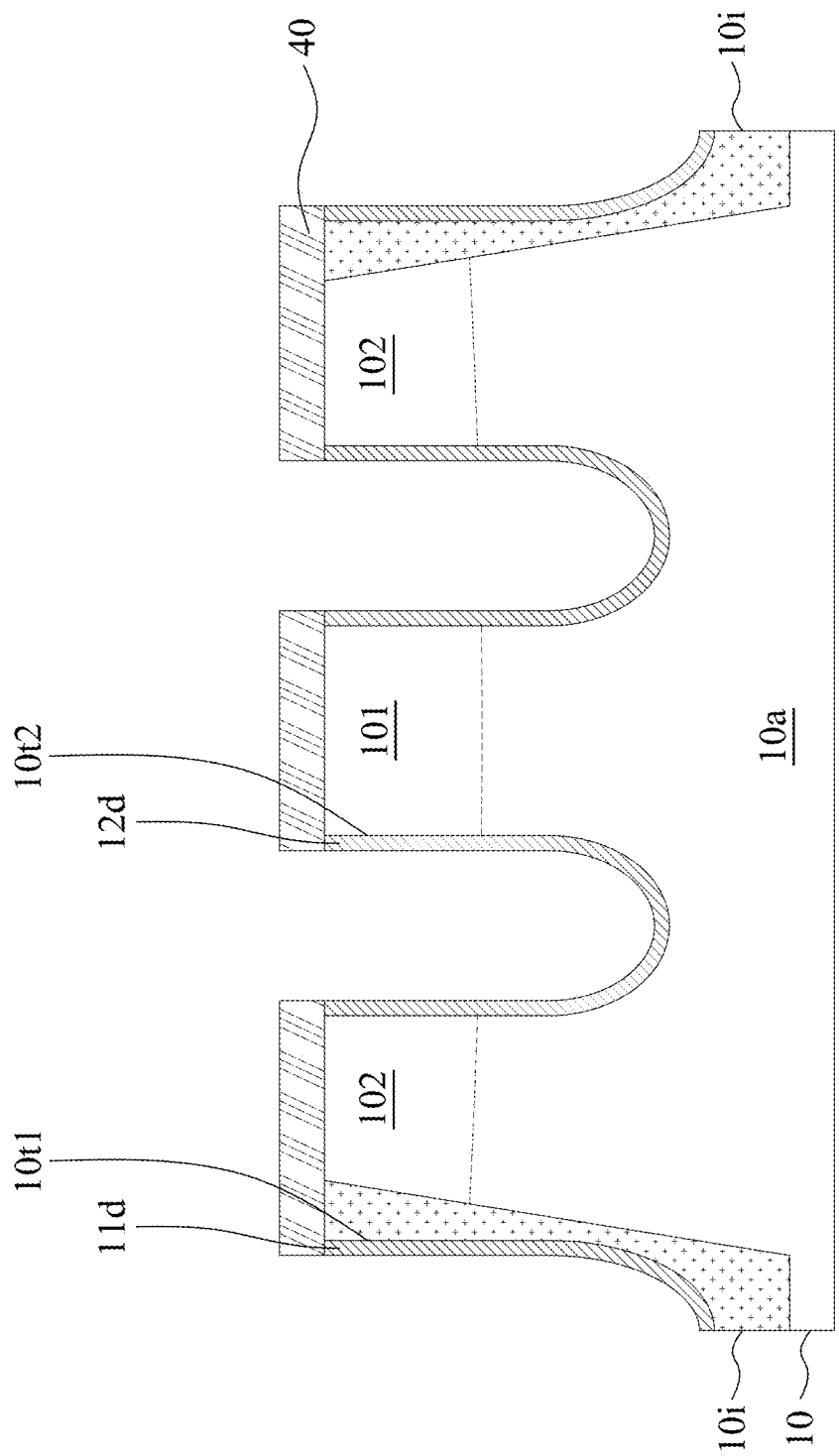
FIG. 4C illustrates one or more stages of a method of manufacturing a semiconductor device in accordance with some embodiments of the present disclosure.

Referring to FIG. 4C, dielectric layers 11*d* and 12*d* may be formed on the surface of each of the trenches 10*t*1 and 10*t*2. Before the dielectric layers 11*d* and 12*d* are formed, the inside surface of each of the trenches 10*t*1 and 10*t*2 damaged by the etch process may be recovered. For example, sacrificial oxide formed by a thermal oxidation treatment can be removed.

The dielectric layers 11*d* and 12*d* may be formed by a thermal oxidation process, such as an in situ steam generation (ISSG) oxidation process. In some embodiments, the dielectric layers 11*d* and 12*d* may be formed by a deposition process, such as a CVD process or an ALD process.

Figure 4D:
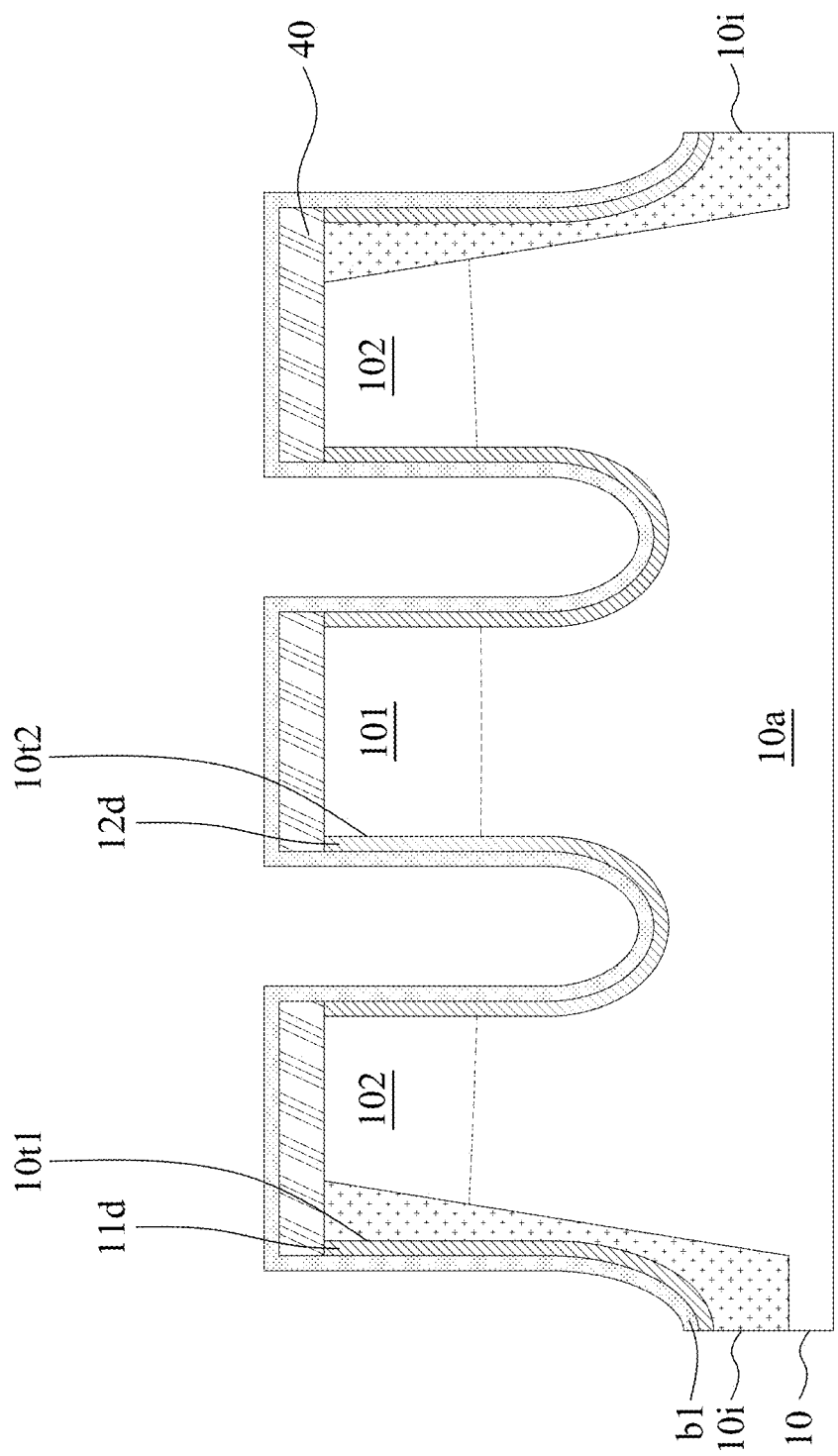
FIG. 4D illustrates one or more stages of a method of manufacturing a semiconductor device in accordance with some embodiments of the present disclosure.

Referring to FIG. 4D, a barrier layer b1 may be formed on the dielectric layers 11*d* and 12*d* and the hard mask layer 40. The barrier layer b1 may be conformally formed on the surface of the dielectric layers 11*d* and 12*d*. The barrier layer b1 may be formed by the ALD or CVD process.

Figure 4E:
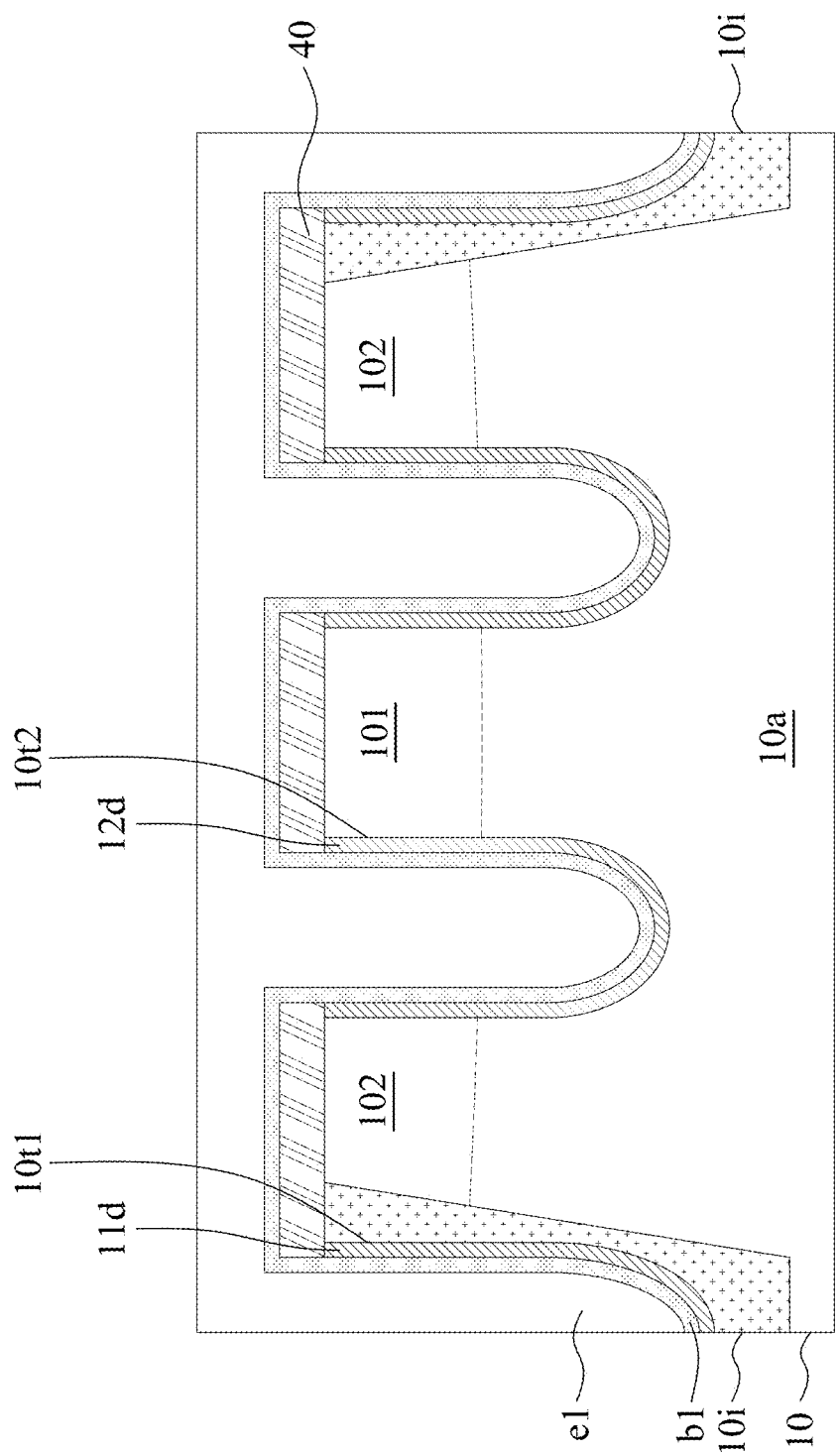
FIG. 4E illustrates one or more stages of a method of manufacturing a semiconductor device in accordance with some embodiments of the present disclosure.

Referring to FIG. 4E, a conductive layer e1 may be formed on the barrier layer b1. The conductive layer e1 may be formed on the barrier layer b1 to fill each of the trenches 10*t*1 and 10*t*2. The conductive layer e1 may include a low-resistance metal material. The conductive layer e1 may include tungsten (W). The conductive layer e1 may be formed by the CVD or ALD process.

Figure 4F:
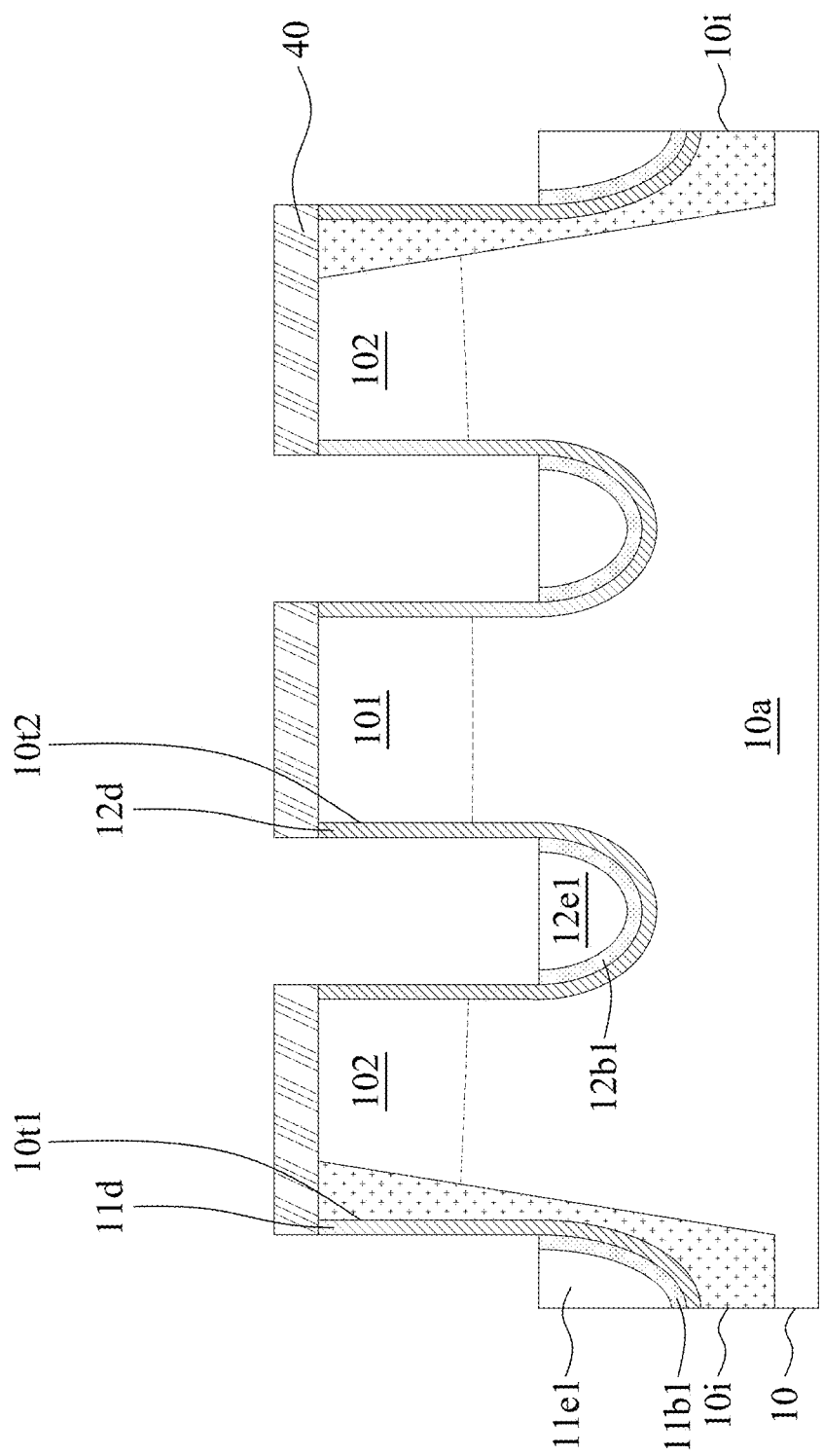
FIG. 4F illustrates one or more stages of a method of manufacturing a semiconductor device in accordance with some embodiments of the present disclosure.

Referring to FIG. 4F, recessing may be performed. The recessing process may be performed by dry etching, for example, an etch-back process. The barrier layers 11*b*1 and 12*b*1 may be formed by performing the etch-back process on the barrier layer b1. The gate electrodes 11*e*1 and 12*e*1 may be formed by performing the etch-back process on the conductive layer e1.

The barrier layer 11*b*1 and the gate electrode 11*e*1 may be formed inside the trench 10*t*1. The top surfaces of the barrier layer 11*b*1 and the gate electrode 11*e*1 may be substantially coplanar or located at the same level. The barrier layer 12*b*1 and the gate electrode 12*e*1 may be formed inside the trench 10*t*2. The top surfaces of the barrier layer 12*b*1 and the gate electrode 12*e*1 may be substantially coplanar or located at the same level.

In some embodiments, a planarization process may be performed in advance to expose the top surface of the hard mask layer 40, and then the etch-back process may be performed.

Figure 4G:
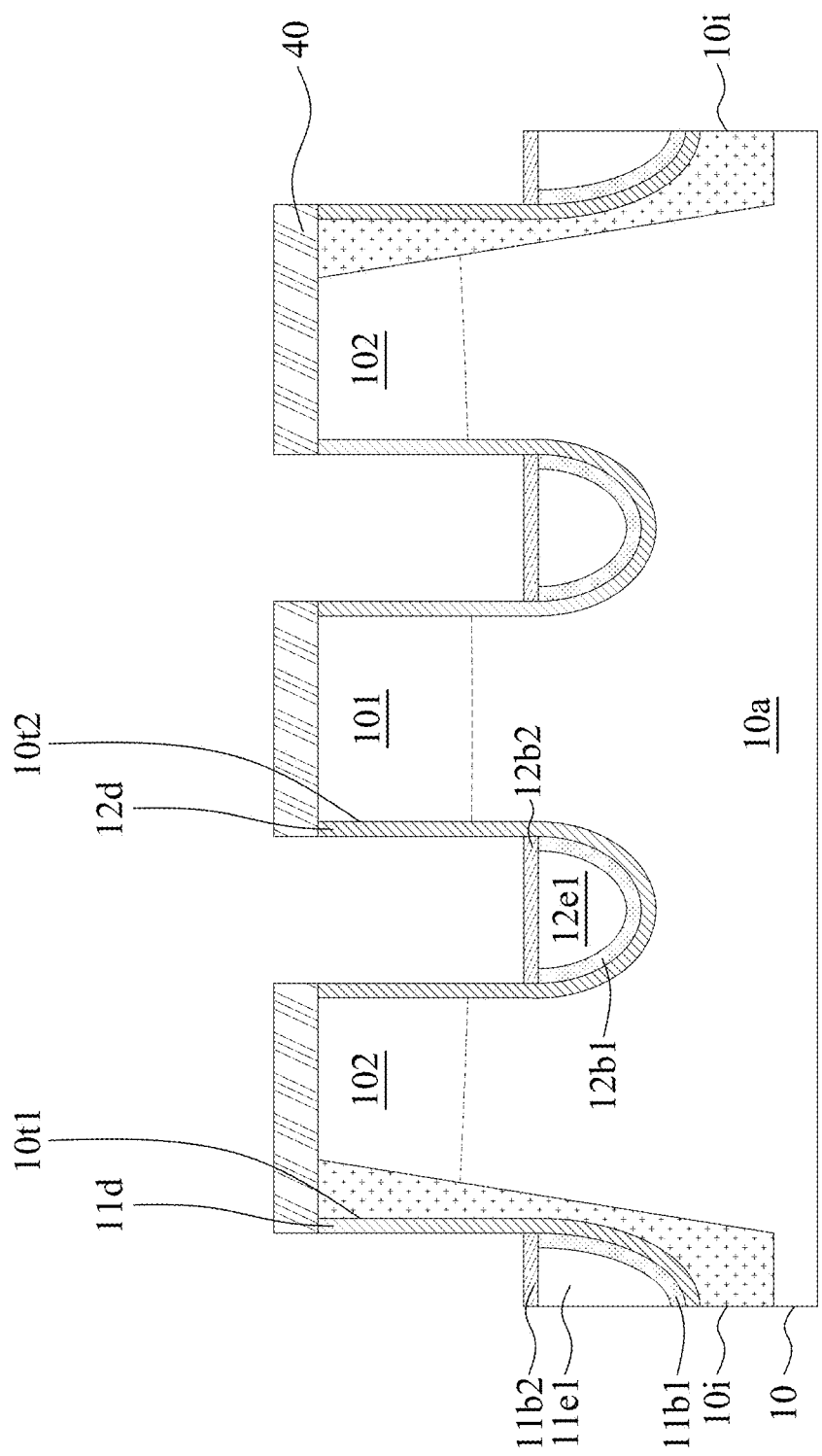
FIG. 4G illustrates one or more stages of a method of manufacturing a semiconductor device in accordance with some embodiments of the present disclosure.

Referring to FIG. 4G, the barrier layer 11*b*2 may be formed on the gate electrode 11*e*1 and the barrier layer 12*b*2 may be formed on the gate electrode 12*e*1. The barrier layers 11*b*2 and 12*b*2 may be formed by physical vapor deposition (PVD).

Figure 4H:
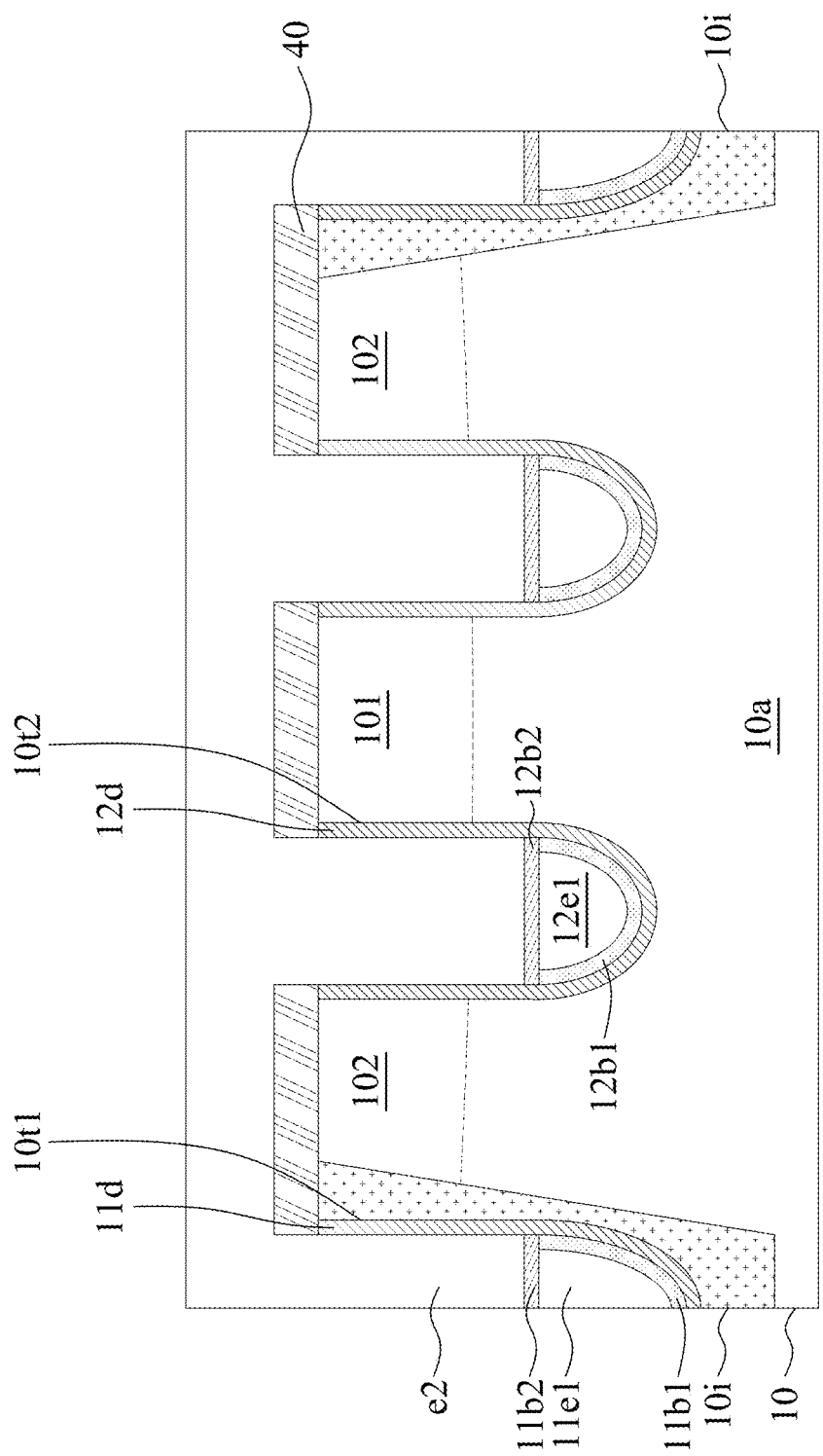
FIG. 4H illustrates one or more stages of a method of manufacturing a semiconductor device in accordance with some embodiments of the present disclosure.

Referring to FIG. 4H, a conductive layer e2 may be formed on the barrier layer 11*b*2 and the barrier layer 12*b*2. The conductive layer e2 may fill each trench. The conductive layer e2 may include a material having a low work function. The conductive layer e2 may include polysilicon having a low work function, for example, polysilicon doped with an N-type impurity. The conductive layer e2 may be formed by CVD or ALD.

Figure 4I:
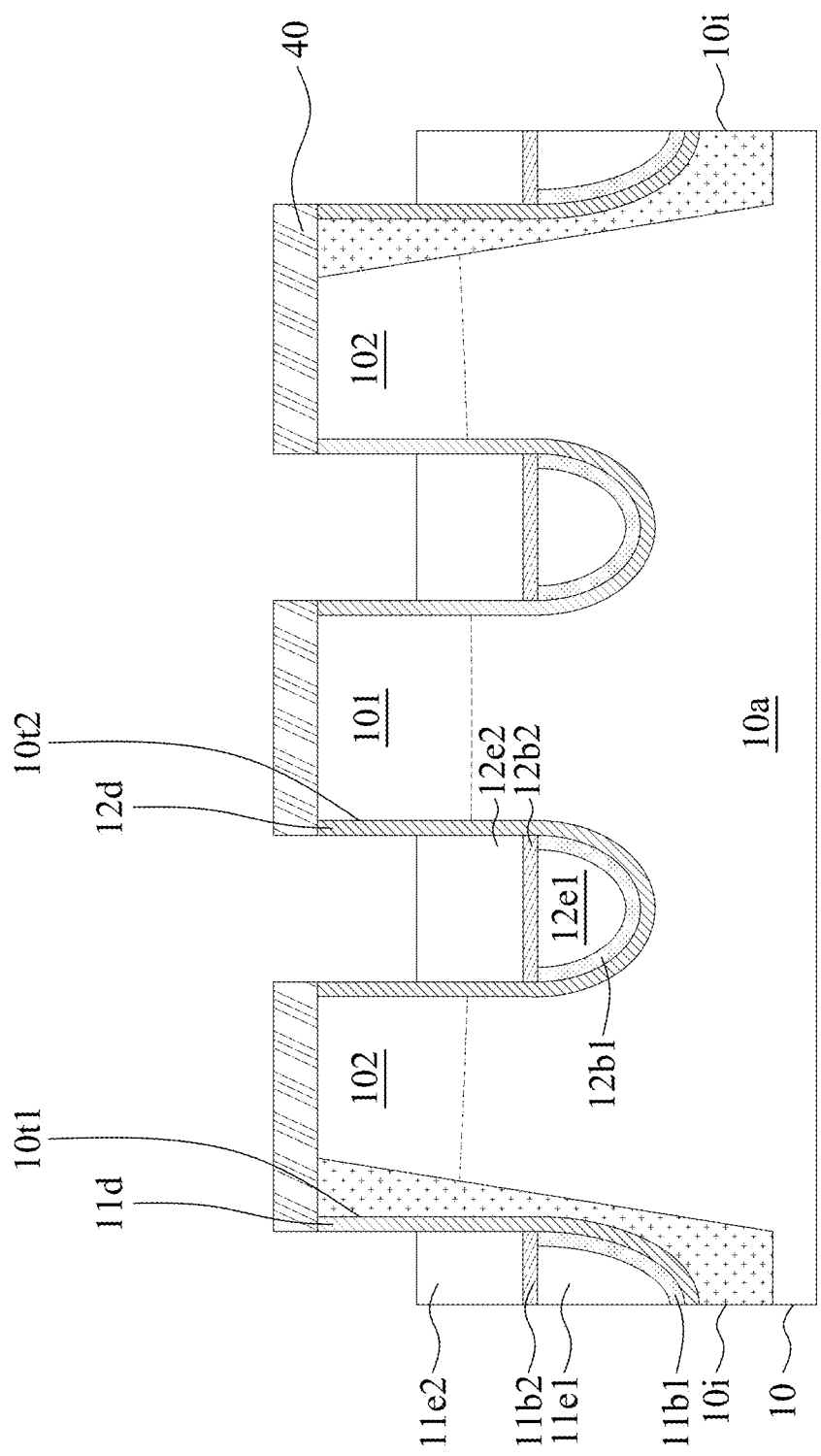
FIG. 4I illustrates one or more stages of a method of manufacturing a semiconductor device in accordance with some embodiments of the present disclosure.

Referring to FIG. 4I, recessing may be performed. The recessing process may be performed by dry etching, for example, an etch-back process. The gate electrodes 11*e*2 and 12*e*2 may be formed by performing the etch-back process on the conductive layer e2.

Figure 4J:
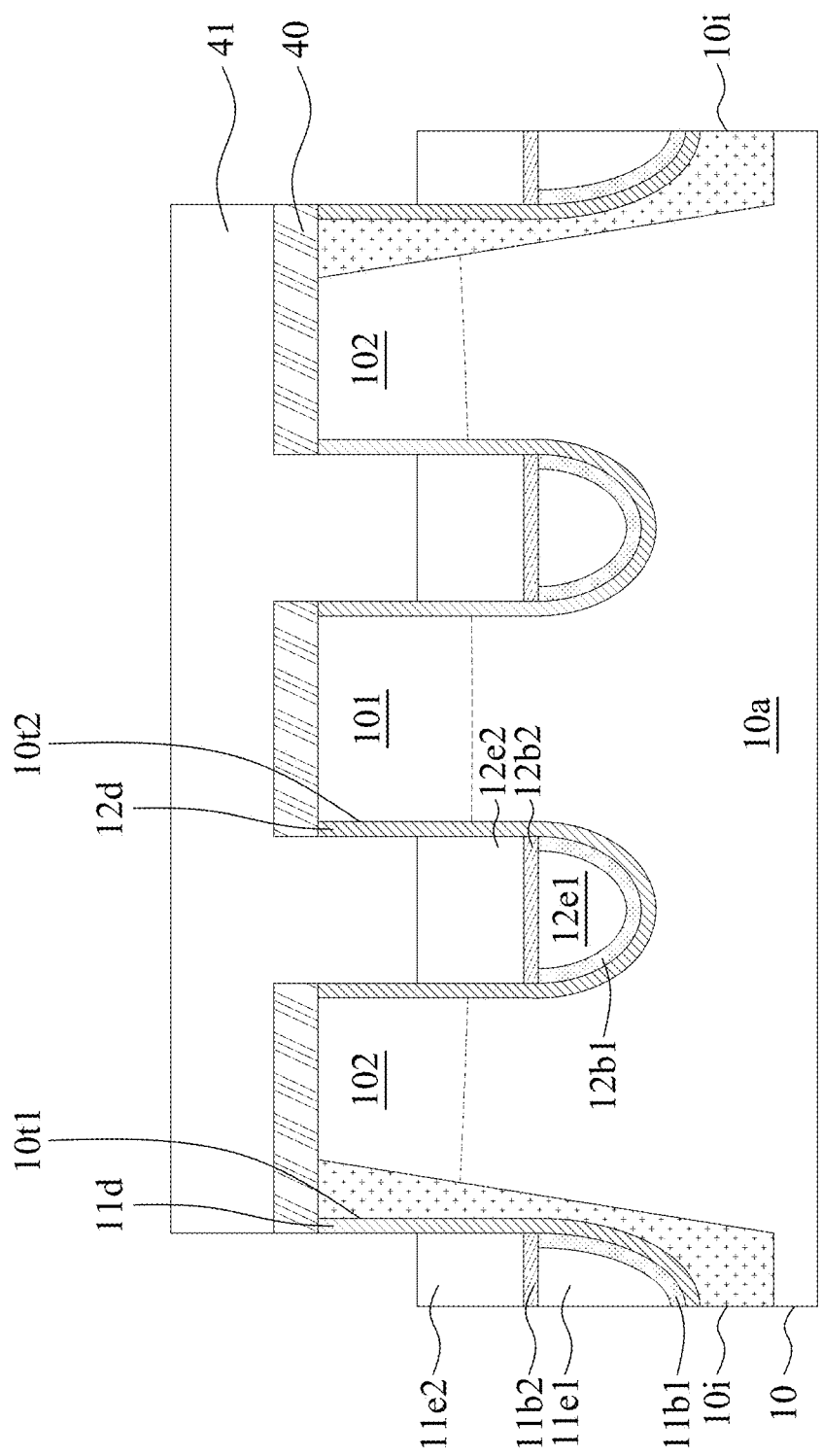
FIG. 4J illustrates one or more stages of a method of manufacturing a semiconductor device in accordance with some embodiments of the present disclosure.

Referring to FIG. 4J, a mask 41 may be provided over the main gate portions (such as the gate electrode 12*e*2). The mask 41 may have openings over the passing gate portions (such as the gate electrodes 11*e*2).

Figure 4K:
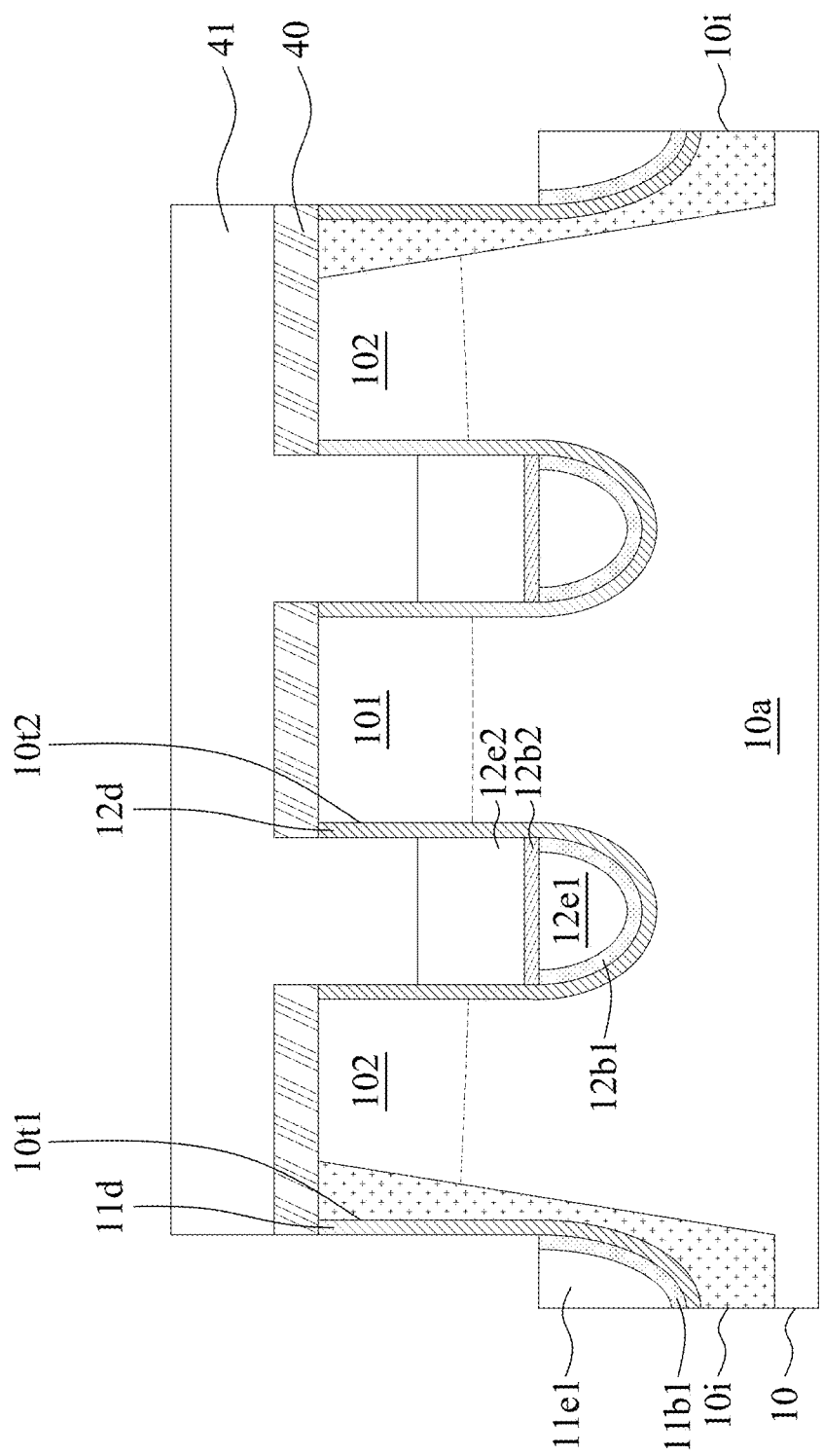
FIG. 4K illustrates one or more stages of a method of manufacturing a semiconductor device in accordance with some embodiments of the present disclosure.

Referring to FIG. 4K, the barrier layer 12*b*2 and the gate electrode 12*e*2 may be removed by an etching process using the mask 41 as an etch mask. Therefore, a top surface of the gate electrode 12*e*1 may be exposed from the mask 41. A portion of the barrier layer 11*b*1 may also be exposed from the mask 41. In some embodiments, the gate electrode 12*e*2 may also be referred to as a dummy gate electrode or a sacrificial gate electrode.

Figure 4L:
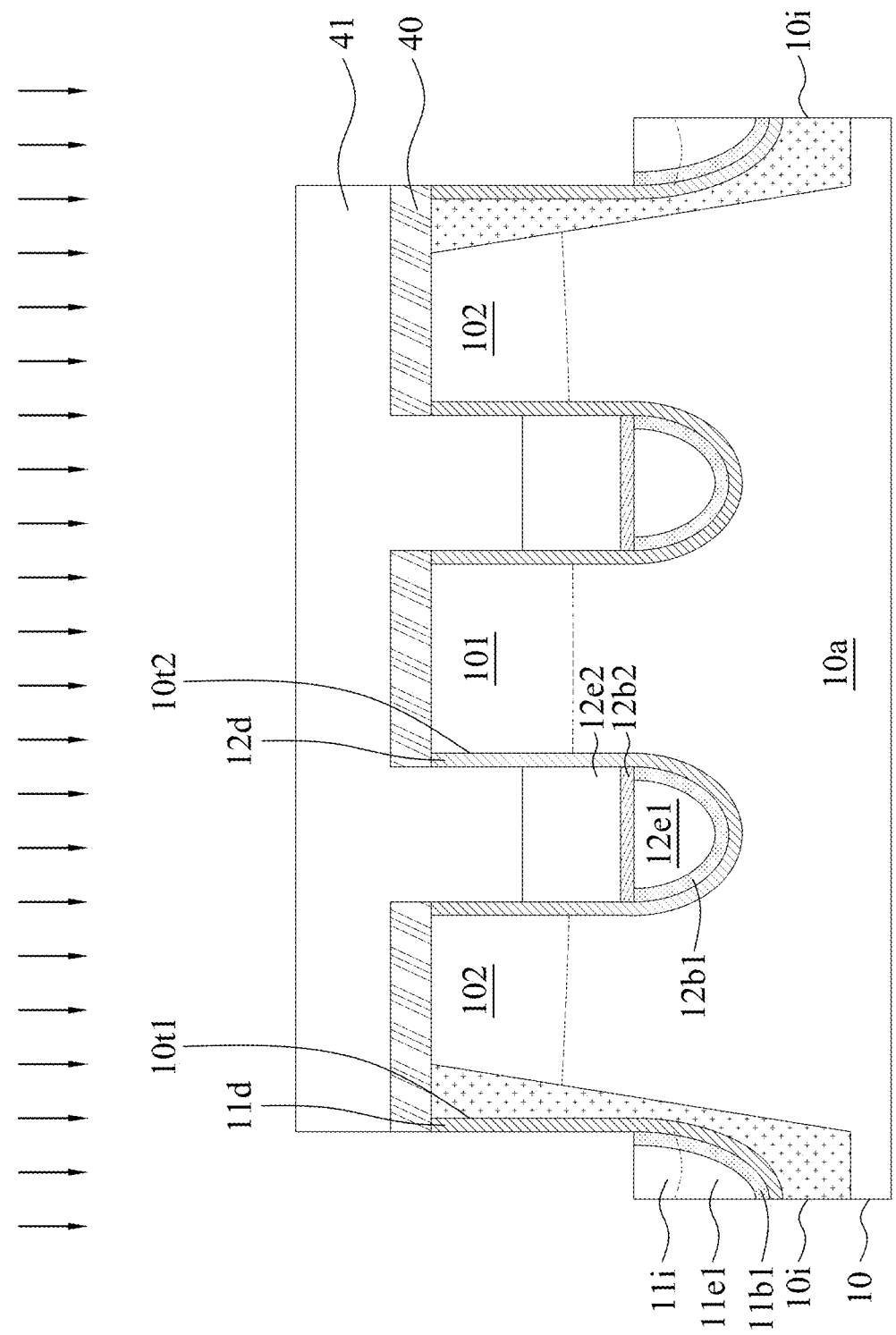
FIG. 4L illustrates one or more stages of a method of manufacturing a semiconductor device in accordance with some embodiments of the present disclosure.

Referring to FIG. 4L, the doped region 11*i* may be formed in the gate electrode 11*e*1. Arrows represent the implanting of dopants into the gate electrode 11*e*1. The dopants may be implanted into the top surface of the gate electrode 11*e*1 and the exposed portion of the barrier layer 11*b*1. The implant may be performed by any suitable ion beam implanting system.

The mask 41 that has been used to remove barrier layer 11*b*2 and the gate electrode 11*e*2 as explained with respect to FIG. 4K may be used as a mask to form the doped region 11*i*. This obviates the need to provide another mask, thereby eliminating costly lithography and etch steps.

In some embodiments, the gate electrode 11*e*1 may be implanted with more than one kind of dopant to produce desired electrical characteristics. For example, dopants of different ion species, different molecular masses, different valence electrons and/or different concentrations may be implanted into the gate electrode 11*e*1.

Each of the dopants may be implanted serially in a suitable ion implanting system. Alternatively, two implants may be performed simultaneously by an ion implanting system having dual dopant beams where one dopant beam may perform an implant step at one implant energy and the other dopant beam may perform another implant step at a different implant energy.

In some embodiments, the mask 41 may be removed before the implant is performed. Therefore, the doped region 12i may be formed in the gate electrode 12e2 as shown in FIG. 1C. In some embodiments, the dopants may be implanted into top surface of the gate electrode 12e2 and the doped regions 101 and 102.

To prevent dopant displacement in the doped regions 101 and 102, the penetration depth of the dopants implanted into the gate electrode 12e2 may be less than that of the dopants implanted into the doped regions 101 and 102. For example, the molecular mass of the dopants implanted into the gate electrode 12e2 may be greater than the molecular mass of the dopants implanted into the doped regions 101 and 102. For example, the implant energy of the dopants implanted into the gate electrode 12e2 may be lower than the implant energy of the dopants implanted into the doped regions 101 and 102.

In some embodiments, at least a part of the barrier layer 11b2 may remain on the gate electrode 12e1. In some embodiments, the dopants may be implanted into the barrier layer 11b2.

In some embodiments, after the implant, an annealing operation may be conducted. During annealing, the implanted dopants may be activated. Additionally, implant damage (e.g., amorphization and crystalline damaged) may be repaired by means of crystalline re-growth. In some embodiments, the barrier layer 11b2 may prevent the dopants from penetrating into the substrate 10.

Figure 4M:
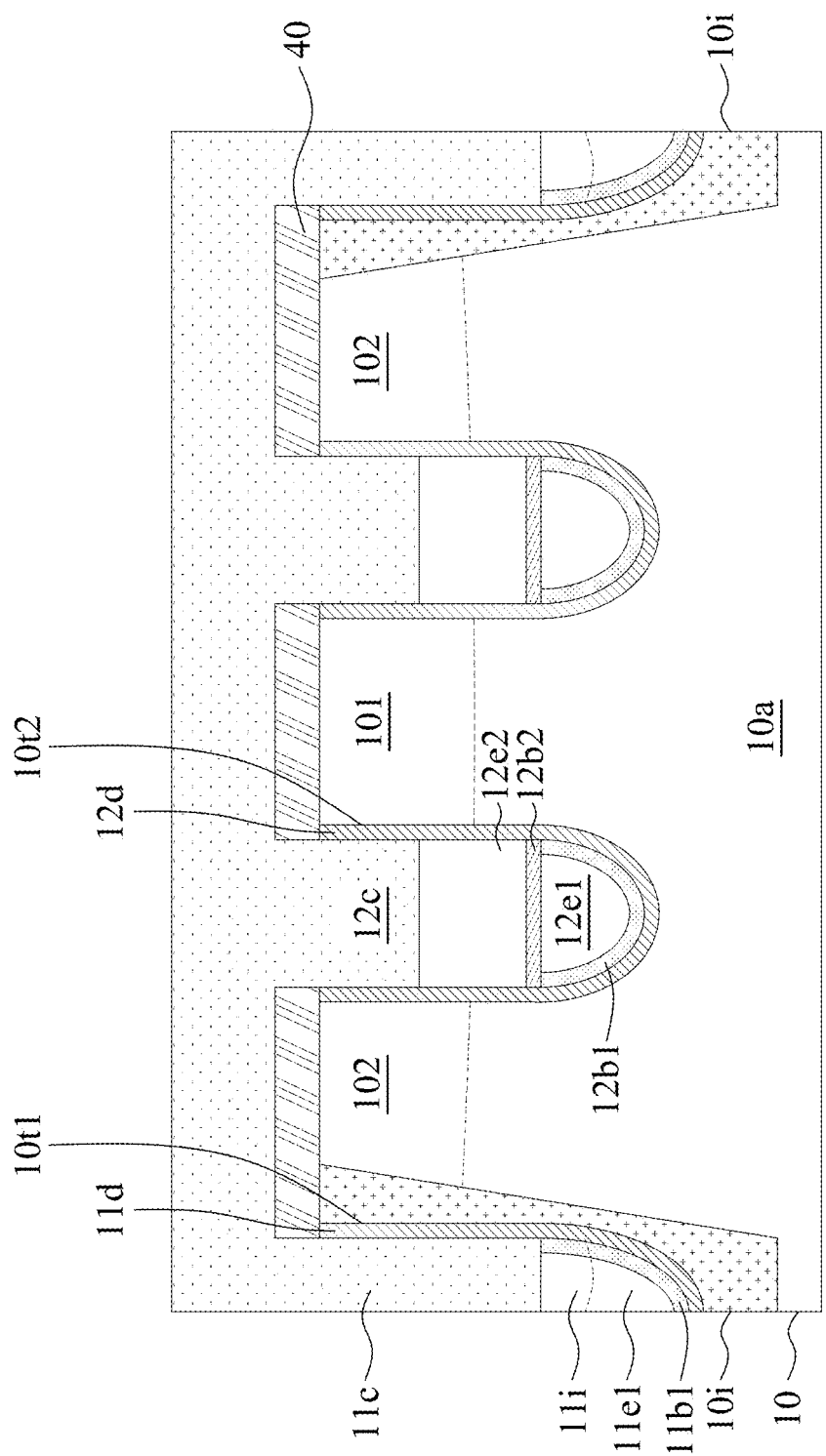
FIG. 4M illustrates one or more stages of a method of manufacturing a semiconductor device in accordance with some embodiments of the present disclosure.

Referring to FIG. 4M, the mask 41 may be removed. The capping layers 11c and 12c may be formed on the gate electrode 11e1 and the gate electrode 12e2 to fill each of the trenches 10t1 and 10t2. The capping layer 11c may be formed on the doped region 11i. In some embodiments, the capping layer 12c may be formed on the doped region 12i as shown in FIG. 1C.

Figure 4N:
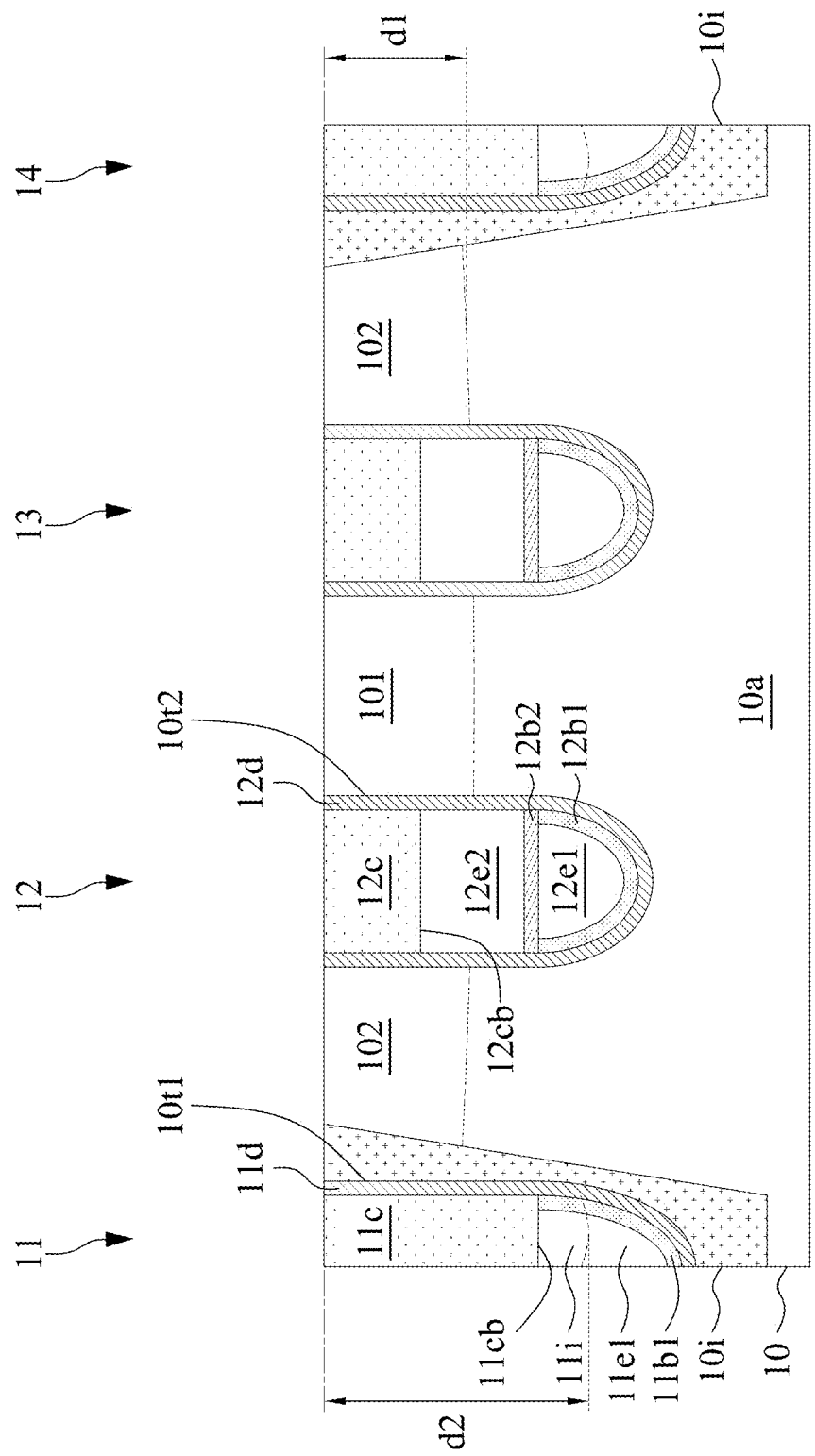
FIG. 4N illustrates one or more stages of a method of manufacturing a semiconductor device in accordance with some embodiments of the present disclosure.

Referring to FIG. 4N, the capping layers 11c and 12c may be planarized and the hard mask layer 40 may be removed. Through the series of processes described here, buried gate structures 11, 12, 13, and 14 may be formed.

Figure 4O:
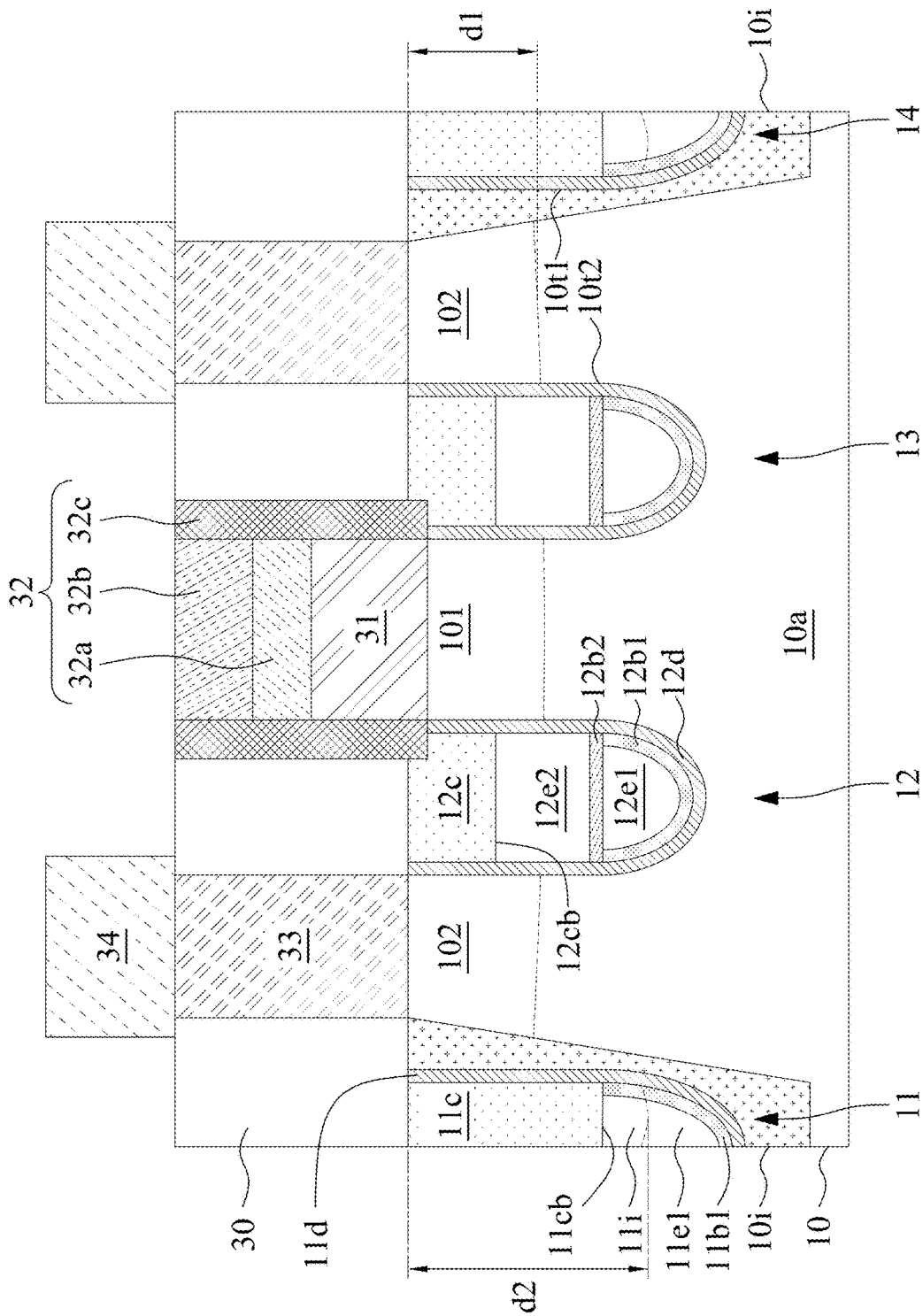
FIG. 4O illustrates one or more stages of a method of manufacturing a semiconductor device in accordance with some embodiments of the present disclosure.

Referring to FIG. 4O, the isolation layer 30 may be formed on the top surface of the structure from FIG. 4N by, for example, ALD, CVD, PVD, remote plasma CVD (RPCVD), plasma enhanced CVD (PECVD), coating, etc. The isolation layer 30 may be patterned to define the locations of the contact plugs 31, 33 formed in the subsequent operations. The contact plug 31 may be disposed over the doped region 101. The contact plug 33 may be disposed over the doped region 102. Then, the bit-line structure 32 may electrically connect the contact plug 31. The memory element 34 may electrically connect the contact plug 33.

In some embodiments, subsequent to the formation of the memory element 34, a wiring layer (not shown in the figures) may be formed on the memory element 34. For example, the wiring layer may have a multilayer wiring structure which includes a plurality of wiring layers and interlayer insulating films.

Figure 5:
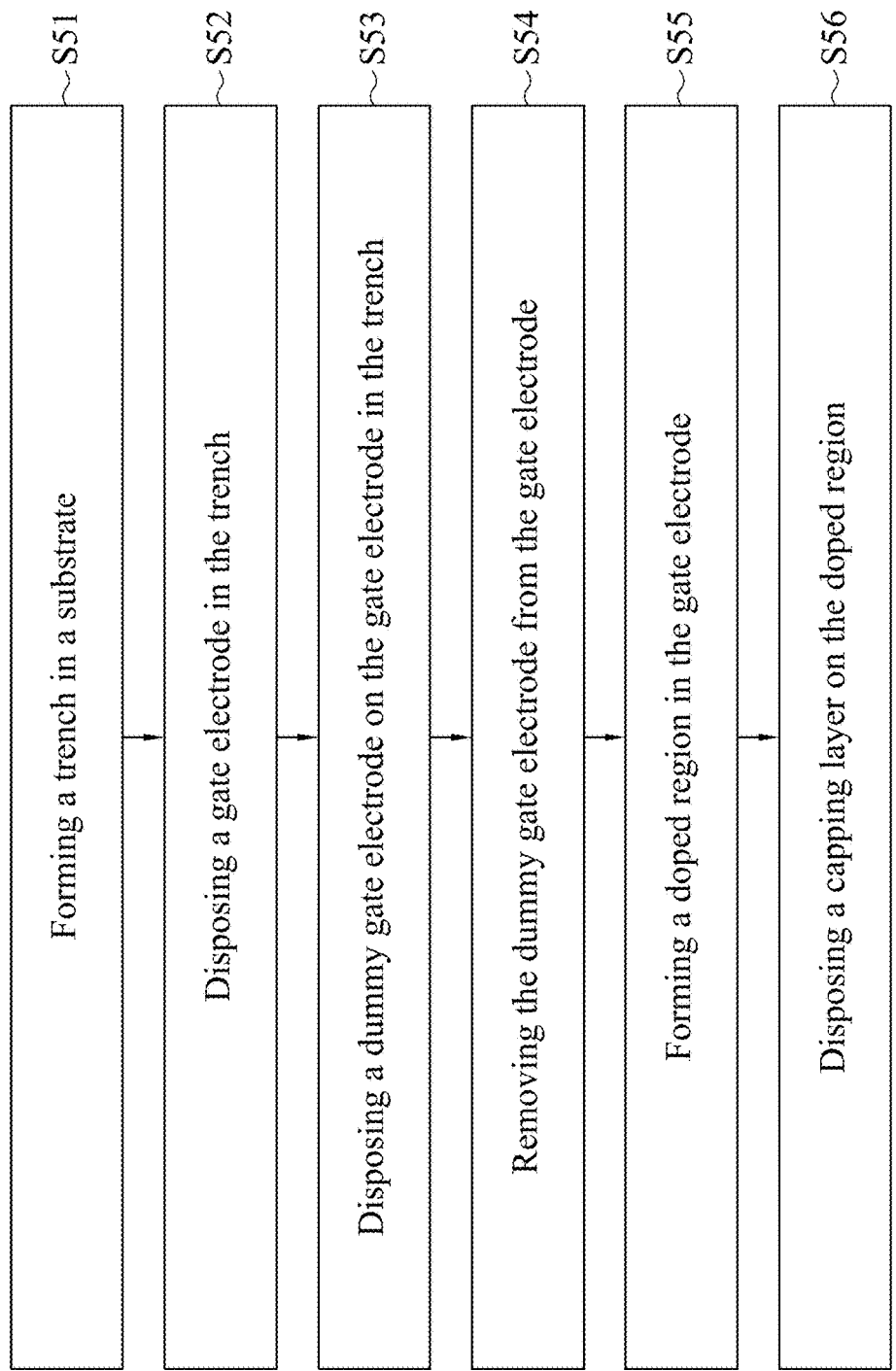
FIG. 5 is a flowchart of a method of manufacturing a semiconductor device in accordance with some embodiments of the present disclosure.

FIG. 5 is a flowchart of a method 50 of manufacturing a semiconductor device in accordance with some embodiments of the present disclosure.

In some embodiments, the method 50 may include a step S51 of forming a trench in a substrate. For example, as shown in FIG. 4B, the plurality of trenches 10t1 and 10t2 may be formed in the substrate 10.

In some embodiments, the method 50 may include a step S52 of disposing a gate electrode in the trench. For example, as shown in FIG. 4E, the conductive layer e1 may be formed on the barrier layer b1. For example, as shown in FIG. 4F, the gate electrodes 11e1 and 12e1 may be formed by performing the etch-back process on the conductive layer e1. In some embodiments, the barrier layers 11b1 and 12b1 may be formed by performing the etch-back process on the barrier layer b1.

In some embodiments, the method 50 may include a step S53 of disposing a dummy gate electrode on the gate electrode in the trench. For example, as shown in FIG. 4H, the conductive layer e2 may be formed on the barrier layer 11b1. For example, as shown in FIG. 4I, the gate electrode 11e2 may be formed by performing the etch-back process on the conductive layer e2.

In some embodiments, the method 50 may include a step S54 of removing the dummy gate electrode from the gate electrode. For example, as shown in FIG. 4J, the mask 41 may be provided over the main gate portions (such as the gate electrode 12e2). The mask 41 may have openings over the passing gate portions (such as the gate electrodes 11e2). As shown in FIG. 4K, the barrier layer 12b2 and the gate electrode 12e2 may be removed by an etching process using the mask 41 as an etch mask.

In some embodiments, the method 50 may include a step S55 of forming a doped region in the gate electrode. For example, as shown in FIG. 4L, the doped region 11i may be formed in the gate electrode 11e1.

In some embodiments, the method 50 may include a step S56 of disposing a capping layer on the doped region. For example, as shown in FIG. 4M, capping layers 11c and 12c may be formed on the gate electrode 11e1 the gate electrode 12e2 to fill each of the trenches 10t1 and 10t2. The capping layer 11c may be formed on the doped region 11i.

One aspect of the present disclosure provides a semiconductor device. The semiconductor device includes a substrate having a first trench and a first gate structure in the first trench. The first gate structure includes a first gate electrode having a first doped region.

Another aspect of the present disclosure provides a semiconductor device. The semiconductor device includes a substrate having a source/drain (S/D) region. The semiconductor device also includes a passing gate having a first doped region. The S/D region and the first doped region are of the same polarity type.

Another aspect of the present disclosure provides a method of manufacturing a semiconductor device. The method includes forming a first trench in a substrate, disposing a first gate electrode in the first trench and disposing a dummy gate electrode on the first gate electrode in the first trench. The method also includes removing the dummy gate electrode from the first gate electrode and forming a first doped region in the first gate electrode.

Implanting impurity ions or dopants into a gate electrode tailors the doping profile of the junction regions and smooths the doping gradient of the junction regions. Therefore, the additional doped region in the gate electrode reduces the effective electric field and consequently reduces GIDL. Hence, interference between word-lines in different memory cells can be avoided. Data retention time can be extended, and operational reliability of the semiconductor device improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
   forming a first trench in a substrate;
   depositing a barrier layer in the first trench;
   disposing a first gate electrode on the barrier layer to fill the first trench;
   disposing a dummy gate electrode on the first gate electrode and the barrier layer in the first trench;
   removing the dummy gate electrode from the first gate electrode and the barrier layer; and
   implanting a dopant into a top surface of the first gate electrode to form a first doped region in the first gate electrode and implanting the dopant into an upper portion of the barrier layer, wherein the upper portion of the barrier layer surrounds the first doped region of the first gate electrode.

2. The method of claim 1, further comprising: forming a second doped region in an active region of the substrate.

3. The method of claim 1, further comprising:
   forming a second trench in the substrate;
   disposing a second gate electrode in the second trench; and
   disposing a third gate electrode on the second gate electrode in the second trench.

4. The method of claim 3, further comprising: providing a mask on the third gate electrode.

5. The method of claim 4, wherein the mask defines the first doped region.

6. The method of claim 4, further comprising: forming a third doped region in the third gate electrode.

7. The method of claim 6, wherein the mask is removed from the third gate electrode before forming the third doped region.

8. The method of claim 1, further comprising: disposing a capping layer on the first doped region.

9. A method of manufacturing a semiconductor device, comprising:
   providing a substrate having a first trench; and
   forming a first gate structure in the first trench, wherein the first gate structure includes a barrier layer in the first trench, and a first gate electrode on the barrier layer to fill the first trench, wherein the first gate electrode includes a first doped region;
   wherein forming the first gate structure comprises:
   disposing the first gate electrode in the first trench; and
   implanting a dopant into a top surface of the first gate electrode to form the first doped region in an upper portion of the first gate electrode and implanting the dopant into an upper portion of the barrier layer, wherein the upper portion of the barrier layer surrounds the first doped region of the first gate electrode.

10. The method of claim 9, wherein forming the first gate structure further comprises forming a first capping layer on the first gate electrode.

11. The method of claim 10, wherein the first capping layer directly contacts the first gate electrode.

12. The method of claim 10, wherein the first doped region is adjacent to the first capping layer.

13. The method of claim 9, wherein the substrate comprises an isolation region and an active region, and the first trench is in the isolation region.

14. The method of claim 13, wherein the active region has a second doped region adjacent to the isolation region, and wherein the first doped region of the first gate structure and the second doped region are of the same polarity type.

15. The method of claim 14, wherein the second doped region comprises a source/drain (S/D) region.

16. The method of claim 9, further comprising: forming a second gate structure in a second trench, wherein the second gate structure includes a second gate electrode and a third gate electrode on the second gate electrode.

17. The method of claim 16, wherein the third gate electrode of the second gate structure has a third doped region.

18. The method of claim 17, wherein the third doped region of the second gate structure and the first doped region of the first gate structure are of the same polarity type.

19. The method of claim 17, wherein the third doped region of the second gate structure and the first doped region of the first gate structure have different dopant concentrations.

20. The method of claim 16, wherein forming the first gate structure further comprises forming a first capping layer on the first gate electrode, and the second gate structure further comprises a second capping layer on the third gate electrode, wherein a bottom surface of the first capping layer and a bottom surface of the second capping layer are located at different elevations, wherein the first doped region is defined in the first gate electrode and the barrier layer.

* * * * *